US007680286B2

(12) United States Patent
Hashimoto et al.

(10) Patent No.: US 7,680,286 B2
(45) Date of Patent: Mar. 16, 2010

(54) SOUND FIELD MEASUREMENT DEVICE

(75) Inventors: Hiroyuki Hashimoto, Kobe (JP); Kenichi Terai, Shijonawate (JP); Koichi Hashimoto, Yokohama (JP); Kazue Satoh, Neyagawa (JP)

(73) Assignee: Panasonic Corporation, Osaka (JP)

( * ) Notice: Subject to any disclaimer, the term of this patent is extended or adjusted under 35 U.S.C. 154(b) by 1318 days.

(21) Appl. No.: 10/852,239

(22) Filed: May 25, 2004

(65) Prior Publication Data

US 2004/0240676 A1 Dec. 2, 2004

(30) Foreign Application Priority Data

May 26, 2003 (JP) ............................ 2003-147241

(51) Int. Cl.
*H04B 1/00* (2006.01)
*H04R 29/00* (2006.01)
*H03G 3/20* (2006.01)
*H04R 3/00* (2006.01)

(52) U.S. Cl. ............................ 381/86; 381/56; 381/57; 381/92

(58) Field of Classification Search .................. 381/86, 381/56, 57, 58, 59, 92
See application file for complete search history.

(56) References Cited

U.S. PATENT DOCUMENTS

| | | | | |
|---|---|---|---|---|
| 4,866,776 | A | 9/1989 | Kasai et al. | |
| 5,829,782 | A * | 11/1998 | Breed et al. | 280/735 |
| 6,862,356 | B1 | 3/2005 | Makino | |

FOREIGN PATENT DOCUMENTS

| | | |
|---|---|---|
| JP | 60-107998 | 6/1985 |
| JP | 04-336800 | 11/1992 |
| JP | 06-084499 | 12/1994 |
| JP | 7-222277 | 8/1995 |
| JP | 2000-198412 | 7/2000 |
| JP | 2001-57699 | 2/2001 |
| JP | 2002-112400 | 4/2002 |

OTHER PUBLICATIONS

European Search Report issued Apr. 28, 2008 for the corresponding European Application EP 4012210.3.

* cited by examiner

*Primary Examiner*—Vivian Chin
*Assistant Examiner*—Douglas J Suthers
(74) *Attorney, Agent, or Firm*—Wenderoth, Lind & Ponack, L.L.P.

(57) ABSTRACT

A wide frequency range signal from a test sound source is reproduced successively by a plurality of speakers, and the reproduced sound is detected by a plurality of microphones, after which the frequency characteristics are obtained at FFTs, while obtaining the frequency characteristics of the wide frequency range signal at an FFT. A high frequency range level is normalized with a low frequency range level, and a determination section compares the normalized value with a reference value stored in a reference value storage section to determine the number and positions of people in the sound field. The transfer functions between the speakers and the microphones are calculated at transfer function calculators, and impulse responses are obtained at IFFTs, after which a reverberation time calculator calculates the reverberation time based on the impulse responses. An audio signal is adjusted based on the results.

6 Claims, 18 Drawing Sheets

$$\tau = d\cos\theta / c$$

SOUND FIELD MEASUREMENT DEVICE

BACKGROUND OF THE INVENTION

1. Field of the Invention

The present invention relates to a sound field measurement device for determining the number of people and their positions in a sound field where an audio signal is outputted and for measuring the reverberation time of the sound field.

2. Description of the Background Art

When an audio signal is reproduced from a CD or a DVD in a room (e.g., a listening room, or an automobile cabin), there are usually one or more listeners in the room, i.e., in the sound field. Since the listeners are inevitably present at different positions (they cannot physically be present at exactly the same position), it would be desirable if the tone quality, the sense of sound field, the sense of sound localization, etc., can be adjusted optimally for the number and positions of the listeners. Since a human is by nature a sound absorber, the reverberation time of a sound field varies depending on the number of people present therein. The reverberation time also varies depending on the interior finish of the room. Therefore, the reverberation time should also be adjusted optimally. To do so, it is necessary to determine the number and positions of people in the sound field, and the reverberation time.

It is of course possible by using a special measurement device, but such a device is expensive, and it requires a complicated process and a high level of expertise to be able to use such a device. At present, such a device has not been in general use as a consumer product. Measurement of an in-cabin sound field performed in connection with the use of a car audio system has also been a service rendered by a professional at a specialty shop. In such a service, the measurement is done at a single position using a single microphone. Measurement at a plurality of positions needs to be done while moving the microphone from one position to another. Thus, if fixed microphones are to be used, one microphone is needed for each listener (or each seat).

In a conventional approach, the audio signal adjustment is done by detecting the passenger position using a passenger sensor or a seat position detector capable of physically detecting the position of an object, instead of using a microphone for detecting an acoustic signal (see, for example, Japanese Laid-Open Patent Publication Nos. 2002-112400 and 7-222277).

In another conventional approach, passenger detection is done by using a microphone installed in a sound field. It is important in this conventional approach that the microphone is installed at a position such that sound outputted from a speaker toward the microphone is blocked by a passenger when seated, whereby the presence/absence of passengers is determined based on the level of the detection signal obtained by the microphone. Thus, the passenger detection is based primarily on the change in the direct sound portion of the sound outputted from the speaker (see, for example, Japanese Laid-Open Patent Publication No. 2000-198412).

With the seat position detection, however, the presence/absence of a passenger cannot be detected. With the passenger sensor, which does not detect the change in the sound field itself, it is not possible to know how sound-absorbing a passenger is, how much the tone quality is changed, or how much the sound field is influenced by a piece of sound-absorbing luggage present in the automobile.

Moreover, one microphone is needed for each passenger, and only one microphone is used for the detection of each passenger. Therefore, if the microphone is installed at a position where it is strongly influenced by the sound field, there will be an increased error in the level of the signal detected by the microphone. Moreover, the determination is based only on the signal level, and no description is found as to the level fluctuation due to a change in the volume level of the sound outputted from the speaker. Furthermore, since the detection is based primarily on the direct sound, changes in the reverberation characteristics cannot be known.

SUMMARY OF THE INVENTION

Therefore, an object of the present invention is to provide a sound field measurement device capable of more accurately determine the number and positions of people in a sound field. Another object of the present invention is to provide a sound field measurement device capable of more accurately measuring the reverberation time of a sound field. Still another object of the present invention is to provide a sound field measurement device capable of adjusting an audio signal based on the determination/measurement results so that the sense of sound field, the tone quality, the sense of sound localization and the reverberation characteristics are optimally adjusted for a position of a listener in the sound field.

The present invention has the following features to attain the objects mentioned above. Note that reference numerals and figure numbers are shown in parentheses below for assisting the reader in finding corresponding components in the figures to facilitate the understanding of the present invention, but they are in no way intended to restrict the scope of the invention. Also note that the present invention can be implemented in the form of hardware or any combination of hardware and software.

A sound field measurement device of the present invention includes: a test sound source (1) for generating a signal; a plurality of speakers (101, 102, 103, 104) for reproducing the signal from the test sound source to output test sound; a plurality of microphones (111, 112) for detecting the test sound outputted by the plurality of speakers; a measurement section (4*a*, 4*b*, 5*a*, 5*b*, 6*a*, 6*b*, 7*a*, 7*b*, 8, 9) for determining the number and positions of people present in a sound field or calculating a reverberation time of the sound field, based on test sound signals detected by the plurality of microphones.

In a specific example of the sound field measurement device, the test sound source generates at least a signal in a high frequency range, and the measurement section includes: a frequency analyzer (4*a*, 4*b* in FIG. 1) for analyzing frequency characteristics of each of the test sound signals detected by the plurality of microphones; a level calculator (6*a*, 6*b*) for calculating a level of each test sound signal based on the analysis by the frequency analyzer; a reference value storage section (9) storing a reference value; and a determination section (8) for comparing the level value of each test sound signal calculated by the level calculator with the reference value stored in the reference value storage section to determine the number and positions of people present in the sound field (FIG. 1).

In another specific example of the sound field measurement device, the measurement section includes: a frequency analyzer (4*a*, 4*b*, 4*c* in FIG. 4) for analyzing the frequency characteristics of test sound signals detected by the plurality of microphones and the frequency characteristics of the signal from the test sound source; a transfer function calculator (10*a*, 10*b*) for calculating a transfer function for each test sound signal based on the analysis by the frequency analyzer; an impulse response calculator (12*a*, 12*b*) for calculating an impulse response from each transfer function calculated by the transfer function calculator; and a reverberation time calculator (13) for calculating a reverberation time of the sound field based on each impulse response calculated by the impulse response calculator.

Preferably, the sound field measurement device further includes an audio signal adjustment section (26, 27, 28, 29) for adjusting at least one of the sound image, the tone quality and the volume of an audio signal according to the number and positions of passengers determined by the determination section.

Preferably, the sound field measurement device further includes an audio signal adjustment section (28, 30) for adjusting the sound field of an audio signal according to the reverberation time calculated by the reverberation time calculator.

Preferably, at least three microphones are used to strengthen the directionality thereof toward an intended speaker.

Preferably, the level calculator calculates the level of each of the test sound signals detected by the plurality of microphones in a predetermined portion of a frequency range of 2 kHz to 8 kHz.

Preferably, the measurement section further includes a high frequency range level calculator (6*a*, 6*b*) and a low frequency range level calculator (5*a*, 5*b*) for calculating a high frequency range (preferably, 2 kHz to 8 kHz) signal level and a low frequency range (preferably, 80 Hz to 800 Hz) signal level, respectively, of each of the test sound signals detected by the plurality of microphones based on the analysis by the frequency analyzer, wherein the determination section determines where a person is present or absent by comparing a normalized value (7*a*, 7*b*) with the reference value stored in the reference value storage section, the normalized value being obtained by normalizing a level value in a predetermined portion of a high frequency range from the high frequency range level calculator with a level value in a predetermined portion of a low frequency range from the low frequency range level calculator.

Preferably, the reverberation time calculator obtains a reverberation attenuation waveform using the Schroeder's integration formula, and obtains the reverberation time based on the gradient of the attenuation waveform.

Preferably, the reverberation time calculator obtains the reverberation time by calculating the difference between the time at which −20 dB is reached along the obtained reverberation attenuation waveform and the time at which −5 dB is reached, and then multiplying the difference by 4.

In the sound field measurement device of the present invention, the test sound outputted from each speaker is detected by a plurality of microphones, and the number and positions of people present in the sound field are determined and the reverberation time of the sound field is calculated based on the detection results obtained from the plurality of microphones. Therefore, as compared with a case where the detection result of a single microphone is used, it is possible to perform the determination and the calculation with a higher precision without being influenced by local variations in the sound field characteristics.

If a music signal or a series of musical tones is used as the wide frequency range test signal, it is possible to perform the measurement without making people in the sound field feel uncomfortable or annoyed.

If at least three microphones are used to strengthen the directionality thereof toward the speaker outputting the test signal, it is possible to determine the number and positions of people present in the sound field with an even higher precision.

The low frequency range level is calculated as the average of level values for predetermined portions of a frequency range where the presence/absence of people does not have a substantial influence (specifically, 80 Hz to 800 Hz), and the high frequency range level is calculated as the average of level values for predetermined portions of a frequency range where the presence/absence of people has a significant influence (specifically, 2 kHz to 8 kHz). Then, the calculated high frequency range level is normalized with the low frequency range level. This is advantageous in that the calculation results are not influenced by the output level of the wide frequency range signal from a speaker.

In the sound field measurement device of the present invention, the wide frequency range signal is reproduced successively by a plurality of speakers, and the reproduced wide frequency range signal is detected by a plurality of microphones. A transfer function is calculated from each detected signal and the original wide frequency range signal to obtain an impulse response from the transfer function. Then, the reverberation time is calculated from each impulse response. This is advantageous in that the influence of a person or sound-absorbing or sound-reflecting luggage present in the sound field can be obtained as a change in the reverberation time.

By using a music signal or a series of musical tones as the wide frequency range signal, it is possible to measure the sound field without making people in the sound field feel uncomfortable or annoyed.

The calculated transfer functions are limited to a frequency range necessary for obtaining the reverberation time (specifically, 2 to 6 kHz), whereby it is possible to calculate the reverberation time with a high precision and without imposing an undue computational load.

In the calculation of the reverberation time, a reverberation attenuation waveform is obtained by using the Schroeder's integration formula, and the difference between the time at which −20 dB is reached along the obtained attenuation waveform and the time at which −5 dB is reached is obtained. Then, the difference is multiplied by 4. Thus, it is possible to obtain the reverberation time with a high precision while reducing the influence of the background noise in the sound field.

The determination results obtained from the determination section are used in the adjustment of the sound field, the tone quality and the sound image of an audio signal. Thus, it is possible to advantageously optimize the audio reproduction according to the number and positions of people present in the sound field.

The calculation results obtained from the reverberation time calculator are used in the adjustment of the sound field of an audio signal, i.e., the adjustment of the reverberation time. Thus, it is possible to advantageously realize audio reproduction while optimizing the reverberation time, which has been changed by the influence of the people, luggage, etc., present in the sound field.

The microphones for measuring the sound field are used also for measuring the background noise in the sound field, and the volume or the frequency characteristics (tone quality) of an audio signal is adjusted according to the level or the frequency characteristics of the detected background noise. Thus, the audio signal can be reproduced and heard with a desirable S/N ratio without being influenced by the background noise.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to FIGS. 1 to 18.

Embodiment 1

Figure 1:
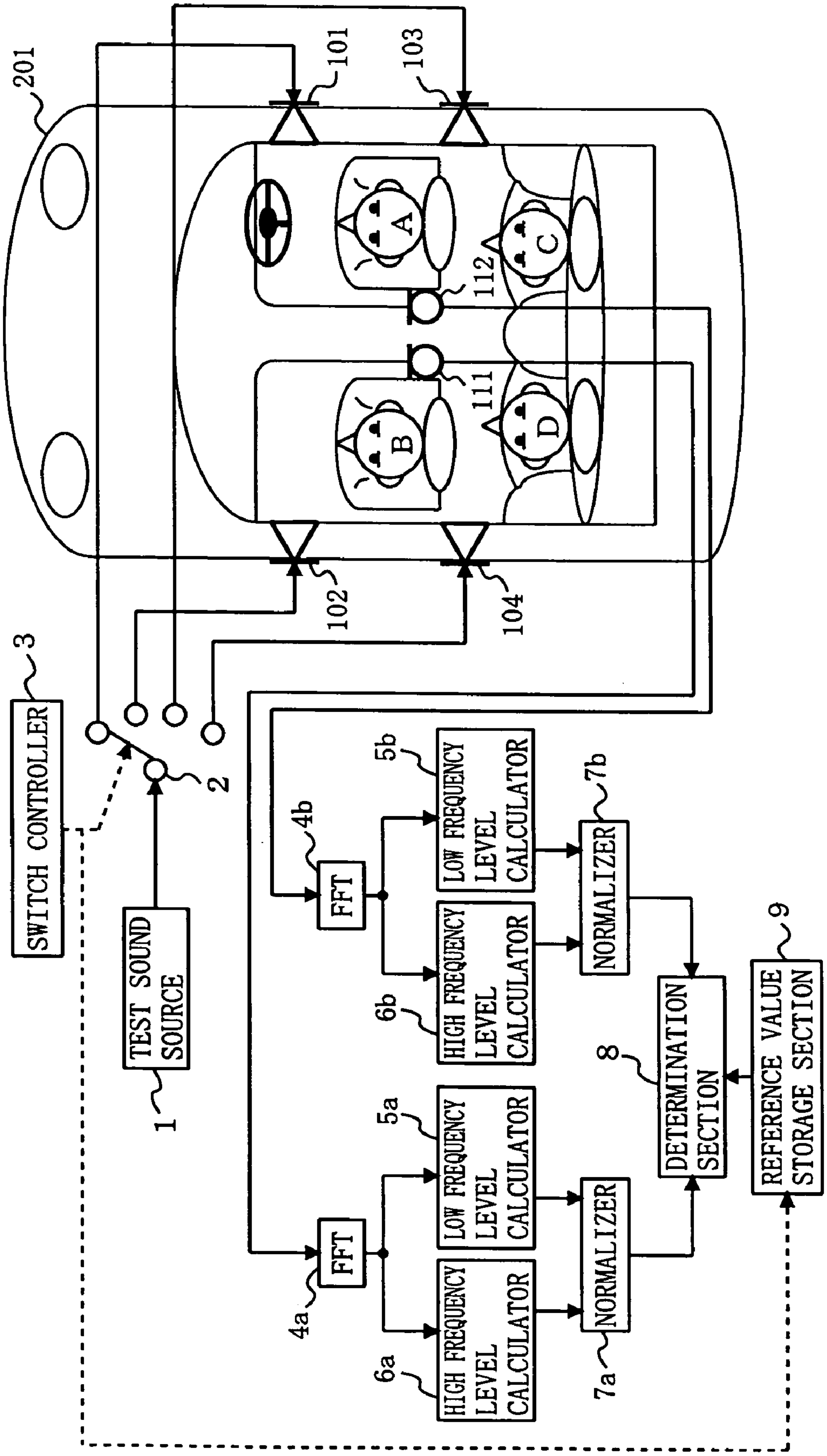
FIG. 1 shows the general configuration of a sound field measurement device according to Embodiment 1 of the present invention being used in an automobile cabin.

FIG. 1 shows a sound field measurement device according to Embodiment 1 of the present invention. Referring to FIG. 1, reference numeral 1 denotes a test sound source, 2 a switch, 3 a switch controller, 4*a* and 4*b* fast Fourier transform (FFT) sections, 5*a* and 5*b* low frequency range level calculators, 6*a* and 6*b* high frequency range level calculators, 7*a* and 7*b* normalizers, 8 a determination section, 9 a reference value storage section, 101 a front-right door speaker, 102 a front-left door speaker, 103 a rear-right door speaker, 104 a rear-left door speaker, 111 and 112 microphones installed on the cabin ceiling near the center of the cabin, and 201 an automobile.

The operation of the sound field measurement device will be described with reference to FIG. 1. As the measurement operation starts, the test sound source 1 generates a wide frequency range signal. The wide frequency range signal from the test sound source 1 is inputted to the switch 2, and is passed onto a selected line according to a control signal from the switch controller 3. Then, the wide frequency range signal is outputted from one of the speakers 101 to 104. The outputted wide frequency range signal is detected by the microphones 111 and 112, and the detected signals are inputted to the FFTs 4*a* and 4*b*, respectively. The FFTs 4*a* and 4*b* calculate the frequency characteristics of the detected signals by Fourier transform. The measurement period can be divided into, for example, four sections and the outputs from the FFTs 4*a* and 4*b* can be averaged for each section, so that stable frequency characteristics can be obtained. Then, the calculation results are inputted to the low frequency range level calculator 5*a* and the high frequency range level calculator 6*a*. The low frequency range level calculator 5*a* obtains the level of the received frequency characteristics for 80 Hz to 500 Hz for each ⅓-octave band. Thus, the low frequency range level calculator 5*a* calculates the level for each of nine ⅓-octave bands whose center frequencies are 80 Hz, 100 Hz, 125 Hz, 160 Hz, 200 Hz, 250 Hz, 315 Hz, 400 Hz and 500 Hz.

If the switch 2 is in the position as shown in FIG. 1, for example, the wide frequency range signal is outputted from the speaker 101 and detected by the microphone 111. The detected sound pressure levels at the microphone 111 for the nine ⅓-octave bands will be denoted as $P_{101\text{-}111}(80)$, $P_{101\text{-}111}(100)$, $P_{101\text{-}111}(125)$, . . . , and $P_{101\text{-}111}(500)$, respectively. Then, the average value ${}_{average}P_{101\text{-}111}(80\text{-}500)$ thereof is obtained as shown in Expression 1 below.

$$
{}_{average}P_{101-111}(80-500) = \{P_{101-111}(80) + P_{101-111}(100) + P_{101-111}(125) + P_{101-111}(160) + P_{101-111}(200) + P_{101-111}(250) + P_{101-111}(315) + P_{101-111}(400) + P_{101-111}(500)\}/9 \quad \text{(Expression 1)}
$$

This average value is the final calculation result from the low frequency range level calculator 5*a*.

In the present embodiment, a simple average of $P_{101\text{-}111}(80)$, $P_{101\text{-}111}(100)$, $P_{101\text{-}111}(125)$, . . . , and $P_{101\text{-}111}(500)$ is used as the final calculation result from the low frequency range level calculator 5*a*. However, the present invention is not limited to this. For example, a detected sound pressure level for a frequency range that is less influenced by the presence/absence of a human may be more weighted relative to others to obtain a weighted average as the final calculation result from the low frequency range level calculator 5*a*.

Next, the high frequency range level calculator 6*a* calculates the level of the received frequency characteristics for 2 kHz to 8 kHz for each of seven ⅓-octave bands whose center frequencies are 2 kHz, 2.5 kHz, 3.15 kHz, 4 kHz, 5 kHz, 6.3 kHz and 8 kHz. The sound pressure levels for the seven ⅓-octave bands will be denoted as $P_{101\text{-}111}(2\text{ k})$, $P_{101\text{-}111}(2.5\text{ k})$, $P_{101\text{-}111}(3.15\text{ k})$, . . . , and $P_{101\text{-}111}(8\text{ k})$, respectively.

Then, the levels obtained by the low frequency range level calculator 5*a* and the high frequency range level calculator 6*a* are inputted to the normalizer 7*a*. The normalizer 7*a* normalizes each high frequency range level detected by the microphone 111 for a ⅓-octave band with the low frequency range level as shown below. Expression 2 below shows the normalization for a center frequency of 2 kHz.

$$_{normalized}P_{101\text{-}111}(2k)=P_{101\text{-}111}(2k)/_{average}P_{101\text{-}111}(80\text{-}500) \quad \text{(Expression 2)}$$

The normalization can be done similarly for other ⅓-octave bands.

As with the microphone 111, each high frequency range level detected by the microphone 112 for a ⅓-octave band is normalized by the normalizer 7*b* with the low frequency range level as shown below. Expression 3 below shows the normalization for a center frequency of 2 kHz.

$$_{normalized}P_{101\text{-}112}(2k)=P_{101\text{-}112}(2k)/_{average}P_{101\text{-}112}(80\text{-}500) \quad \text{(Expression 3)}$$

The normalization can be done similarly for other ⅓-octave bands.

Then, the normalizers 7*a* and 7*b* output the normalized values to the determination section 8. The determination section 8 first calculates the average of the normalized values. Specifically, the average value for a center frequency of 2 kHz can be obtained as shown in the following expression.

$$_{result}P_{101}(2k)=\{_{normalized}P_{101\text{-}111}(2k)+_{normalized}P_{101\text{-}112}(2k)\}/2 \quad \text{(Expression 4)}$$

The average value corresponds to the position of the switch 2 as shown in FIG. 1, i.e., a case where the wide frequency range signal is outputted from the speaker 101.

Where the wide frequency range signal is outputted from the speakers 102 to 104, the average values can be obtained as shown in the following expressions.

$$_{result}P_{102}(2k)=\{_{normalized}P_{102\text{-}111}(2k)+_{normalized}P_{102\text{-}112}(2k)\}/2 \quad \text{(Expression 5)}$$

$$_{result}P_{103}(2k)=\{_{normalized}P_{103\text{-}111}(2k)+_{normalized}P_{103\text{-}112}(2k)\}/2 \quad \text{(Expression 6)}$$

$$_{result}P_{104}(2k)=\{_{normalized}P_{104\text{-}111}(2k)+_{normalized}P_{104\text{-}112}(2k)\}/2 \quad \text{(Expression 7)}$$

The average values for other ⅓-octave bands can be obtained in a similar manner.

The reference value storage section 9 stores reference values. Specifically, the reference value storage section 9 stores average values that would be obtained at the determination section 8 when there are no passengers (i.e., average values that would be obtained by Expressions 4 to 7 when there are no passengers, which may be obtained from actual measurement or may be calculated as ideal values). The stored reference average values are $_{reference}P_{10}(2\text{ k})$, $_{reference}P_{102}(2\text{ k})$, $_{reference}P_{103}(2\text{ k})$ and $_{reference}P_{104}(2\text{ k})$ for 2 kHz (reference values for other frequency ranges are similarly obtained and also stored in the reference value storage section 9). The reference values are selectively inputted to the determination section 8 according to the position at which the presence/absence of a passenger is to be detected.

For example, if the presence/absence of Passenger A is to be detected, the determination section 8 makes a determination using the wide frequency range signal outputted from the speaker 101. Specifically, the determination section 8 determines the presence/absence of Passenger A based on the average values outputted from the normalizers 7*a* and 7*b* corresponding to the detection results of the microphones 111 and 112, respectively, after the wide frequency range signal is outputted from the speaker 101, and based also on one of the reference values stored in the reference value storage section 9 that corresponds to the speaker 101.

First, the difference between the reference value and the detection result is obtained for each frequency band as shown in the following expressions.

$$\Delta P_{101}(2k)=_{reference}P_{101}(2k)-_{result}P_{101}(2k) \quad \text{(Expression 8)}$$

$$\Delta P_{101}(2.5k)=_{reference}P_{101}(2.5k)-_{result}P_{101}(2.5k) \quad \text{(Expression 9)}$$

$$\Delta P_{101}(3.15k)=_{reference}P_{101}(3.15k)-_{result}P_{101}(3.15k) \quad \text{(Expression 10)}$$

$$\Delta P_{101}(4k)=_{reference}P_{101}(4k)-_{result}P_{101}(4k) \quad \text{(Expression 11)}$$

$$\Delta P_{101}(5k)=_{reference}P_{101}(5k)-_{result}P_{101}(5k) \quad \text{(Expression 12)}$$

$$\Delta P_{101}(6.3k)=_{reference}P_{101}(6.3k)-_{result}P_{101}(6.3k) \quad \text{(Expression 13)}$$

$$\Delta P_{101}(8k)=_{reference}P_{101}(8k)-_{result}P_{101}(8k) \quad \text{(Expression 14)}$$

Then, the average of these difference values is calculated as shown in the following expression to obtain a final value A.

$$A=\{\Delta P_{101}(2k)+\Delta P_{101}(2.5k)+\Delta P_{101}(3.15k)+\Delta P_{101}(4k)+\Delta P_{101}(5k)+\Delta P_{101}(6.3k)+\Delta P_{101}(8k)\}/7 \quad \text{(Expression 15)}$$

The presence/absence of Passenger A is determined by comparing the final value A with a predetermined threshold value S. For example, it is determined that:

Passenger A is present if $A \leqq S$; and

Passenger A is absent if $A > S$.

Similarly, if the presence/absence of Passenger B is to be determined, a final value B is obtained as shown in the following expression using the wide frequency range signal outputted from the speaker 102.

$$B=\{\Delta P_{102}(2k)+\Delta P_{102}(2.5k)+\Delta P_{102}(3.15k)+\Delta P_{102}(4k)+\Delta P_{102}(5k)+\Delta P_{102}(6.3k)+\Delta P_{102}(8k)\}/7 \quad \text{(Expression 16)}$$

Then, the final value B is compared with the threshold value S. For example, it is determined that:

Passenger B is present if $B \leqq S$; and

Passenger B is absent if $B > S$.

The presence/absence of Passengers C and D can be determined similarly.

Thus, the presence/absence of a passenger is determined by using a speaker closest to the passenger. Therefore, the characteristics to be detected at the microphones in the presence of the passenger will more likely be distinctly different from those in the absence of the passenger, whereby the presence/absence of passengers can be detected with a high precision.

In the present embodiment, the differences between the reference values and the detection results for various frequency bands are averaged to obtain the final value A, and the presence/absence of Passenger A is determined based on the comparison between the final value A and the predetermined threshold value S. However, the present invention is not limited to this. For example, the differences between the reference values and the detection results for various frequency bands (i.e., $\Delta P_{101}(2\text{ k})$, $\Delta P_{101}(2.5\text{ k})$, $\Delta P_{101}(3.15\text{ k})$, $\Delta P_{101}(4\text{ k})$, $\Delta P_{101}(5\text{ k})$, $\Delta P_{101}(6.3\text{ k})$ and $\Delta P_{101}(8\text{ k})$), or the absolute values thereof, may be each compared with a predetermined threshold value, and the presence/absence of Passenger A may be determined based on the number of difference values that exceed the threshold value.

The wide frequency range signal may be a test signal, including an impulse signal, a random (or burst random) signal such as white noise or pink noise, or a sweep pulse signal (chirp signal). Alternatively, the wide frequency range signal may be a series of musical tones including a piano scale or a plurality of chords, or a music signal. In such a case, the switch controller 3 switches the position of the switch 2 from one to another at an appropriate time taking into consideration the frequency variation of the wide frequency range signal such as a music signal, so that a sufficiently wide frequency range is included in the wide frequency range signal outputted from each of the speakers 101 to 104. Thus, the presence/absence of passengers can be determined even with a music signal, or the like. As a result, the wide frequency range test signal outputted from the speakers 101 to 104 will not make the passengers in the cabin of the automobile 201 feel uncomfortable or annoyed.

Instead of outputting a wide frequency range signal from a test sound source, a low frequency range signal (80 Hz to 500 Hz) and a high frequency range signal (2 kHz to 8 kHz) may be outputted alternately in a time division manner.

In a sound field having complicated acoustic characteristics such as the cabin of the automobile 201, it is preferred that the measurement period is divided into, for example, four sections and the outputs from the FFTs 4*a* and 4*b* are averaged for each section, so that stable frequency characteristics can be obtained. However, in a sound field having more straightforward acoustic characteristics, the averaging operation may be omitted.

In the present embodiment, the low frequency range level calculation is performed for 80 Hz to 500 Hz at the low frequency range level calculators 5*a* and 5*b*. However, the frequency range is not limited to this particular range, as long as a sufficient stability is obtained with any of the acoustic characteristics for the various combinations of the speakers 101 to 104 and the microphones 111 and 112. Normally, a sufficient stability can be obtained for a low frequency range of 80 Hz to 800 Hz in a room that is not so large, such as an automobile cabin or a listening room in a house. Below 80 Hz, the background noise level will become high and influence the S/N ratio. Over 1 kHz, it will be difficult to detect a stable and constant level since the detected level will be influenced by, for example, the presence/absence of a human or a relatively large object in the room.

Similarly, while the high frequency range level calculation is performed for 2 kHz to 8 kHz at the high frequency range level calculators 6*a* and 6*b*, the frequency range is not limited to this particular range, as long as it is a frequency range where the detected level is easily influenced by the presence/absence of a human. However, it has been experimentally confirmed that the detected level will not be influenced sufficiently by the presence/absence of a human below 1 kHz, and the detected characteristics will be excessively influenced by a slight change in the sound field such as a movement of a passenger or the presence/absence of an object (including a relatively small object) over 10 kHz.

In the present embodiment, the high frequency range level, which is likely to be influenced by the presence/absence of a human, is normalized with the low frequency range level, which is stable (i.e., less influenced by the presence/absence of a human). Therefore, the determination result is not influenced by the output level of the wide frequency range signal from the speakers 101 to 104. Thus, even if the output levels of the speakers 101 to 104 are different from those in the previous measurement process, or even if they are varied during a single measurement process, the determination results will not be influenced. Furthermore, where actual measurement values are used as the reference values stored in the reference value storage section 9, the presence/absence of Passengers A to D may be detected using an output level different from that used when measuring the reference values. This means that it is not necessary that the reference value storage section 9 stores different sets of reference values for different output levels but it is only necessary that it stores a single set of reference values (including a reference value for each speaker and for each frequency band) that is measured at one output level. Of course, where the reference value storage section 9 has a large storage capacity and the determination section 8 can afford some extra amount of calculation, the reference value storage section 9 may store different sets of reference values corresponding to a plurality of output levels (each reference value in this case is the average of the two output values for the microphones 111 and 112 that are outputted from the high frequency range level calculators 6*a* and 6*b* in response to the wide frequency range signal outputted at one of the output levels in the absence of a passenger). Then, in the detection of a passenger, the average of two output values for the microphones 111 and 112 that are outputted from the high frequency range level calculators 6*a* and 6*b* can be compared with the reference value for a corresponding output level, without normalizing the average value with the low frequency range level. In such a case, the test sound source 1 is only required to output signals in the high frequency range, and the low frequency range level calculators 5*a* and 5*b* and the normalizers 7*a* and 7*b* can be omitted.

In the present embodiment, the input signals to the low frequency range level calculators 5*a* and 5*b* and the high frequency range level calculators 6*a* and 6*b* are subjected to the ⅓-octave band separation operation. This operation provides an effect of averaging the input signal so that there will be no significant influence of peaks and dips at a single frequency. Therefore, it may be replaced with an appropriate band filter, e.g., a 1/12-octave band filter, a 1/1-octave band filter, or the like, according to the frequency characteristics of the wide frequency range signal used in the measurement and the acoustic characteristics of the sound field to be measured.

While the speakers 101 to 104 are installed in the doors inside the cabin in the present embodiment, the present invention is not limited to this as long as they are installed so that the presence/absence of a passenger will have some influence.

Figure 2:
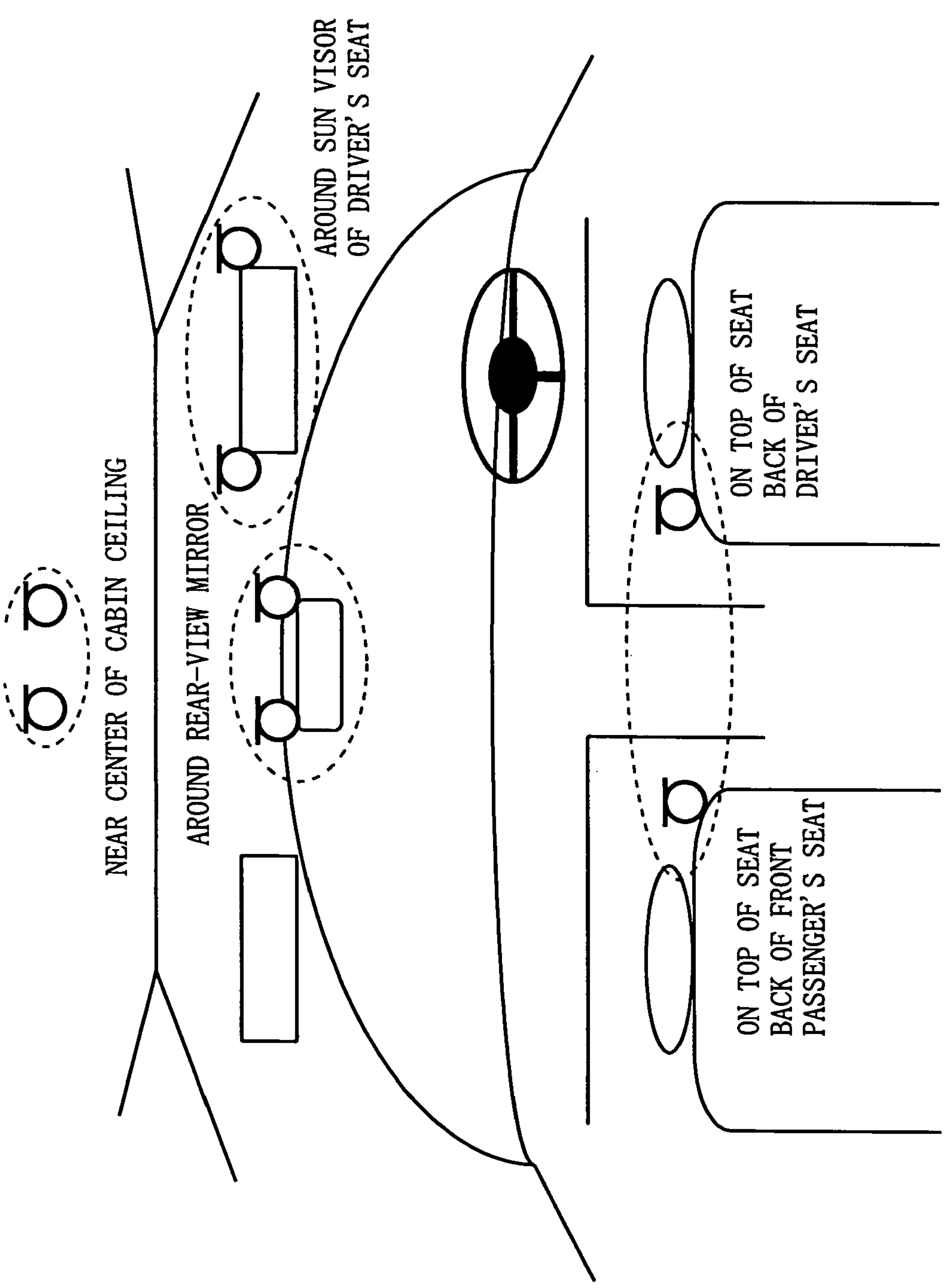
FIG. 2 shows positions where microphones can be installed.

While the microphones 111 and 112 are installed on the cabin ceiling near the center of the cabin in the present embodiment, the present invention is not limited to this. In other embodiments, the microphones 111 and 112 may be installed on top of the seat back of the driver's seat or the front passenger's seat near the center of the cabin, around the sun visor of the driver's seat, or around the rear-view mirror, as shown in FIG. 2.

Thus, the speakers and the microphones may be installed at any positions as long as the presence/absence of a passenger has an influence on the acoustic characteristics in the high frequency range between a speaker and the microphones so that the presence/absence of the passenger can be detected.

While two microphones are used in the present embodiment, the present invention is not limited to this. If the number of microphones is increased, the amount of information to be obtained is also increased, thereby improving the precision in the determination of the presence/absence of passengers. Where only one microphone is used, as with the conventional invention, the microphone may possibly be installed at an abnormality point of the sound field (i.e., a position where the sound pressure level detected by the microphone is abnormally higher or lower than other neighboring positions), in which case it is not possible to stably and accurately determine the presence/absence of passengers. In contrast, in the present invention, a test sound outputted from each speaker is detected simultaneously by a plurality of microphones, and the sound field characteristics calculated based on the detection results obtained from the microphones are averaged, whereby it is possible to stably and accurately determine the presence/absence of passengers.

Figure 3:
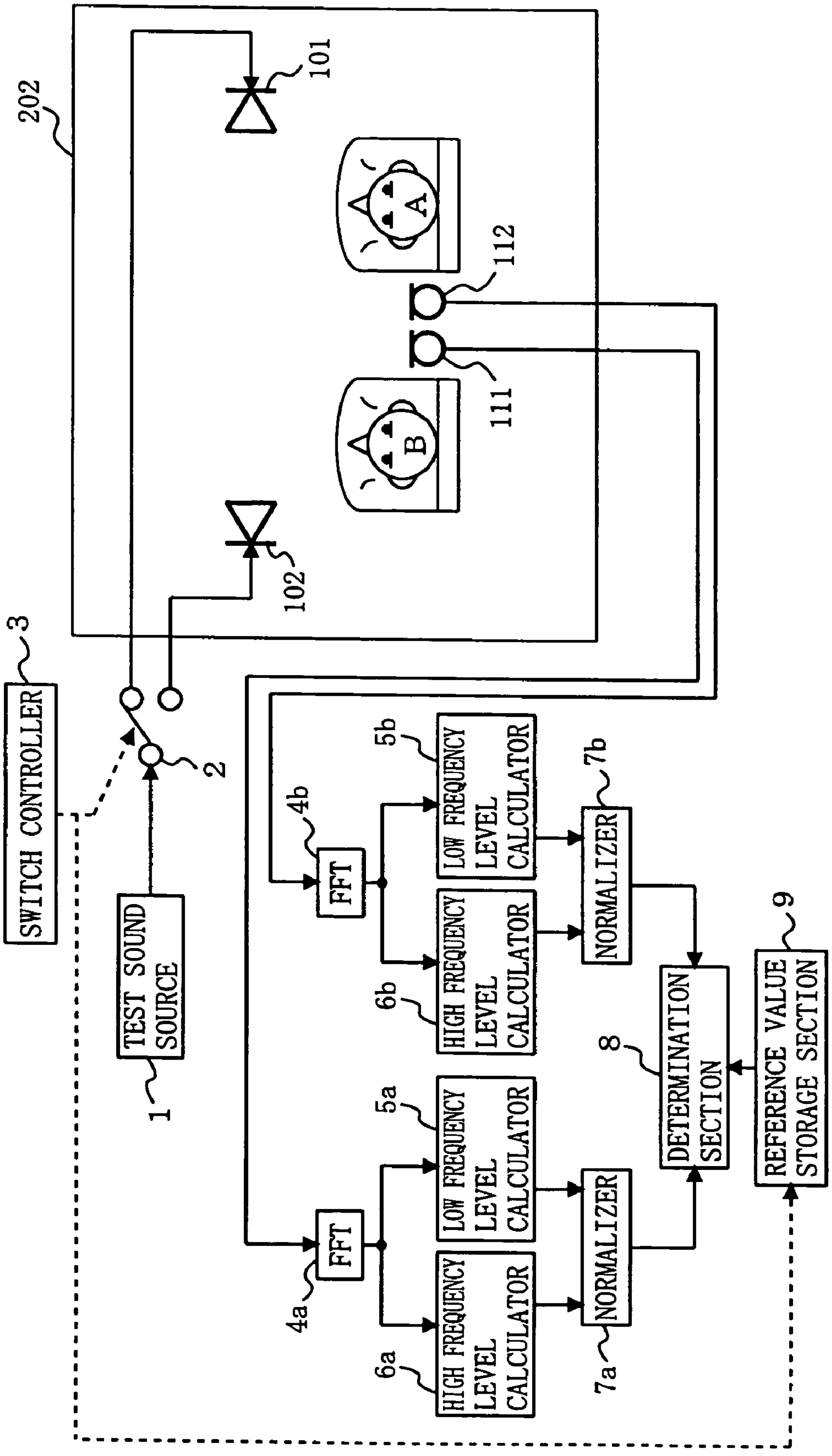
FIG. 3 shows the general configuration of the sound field measurement device of Embodiment 1 being used in a general listening room.

While the present embodiment is directed to a measurement method for detecting a passenger in the cabin of the automobile 201, the present invention is not limited to measurement inside an automobile cabin. In other embodiments, the measurement can be performed in an ordinary listening room 202 as shown in FIG. 3.

Embodiment 2

Figure 4:
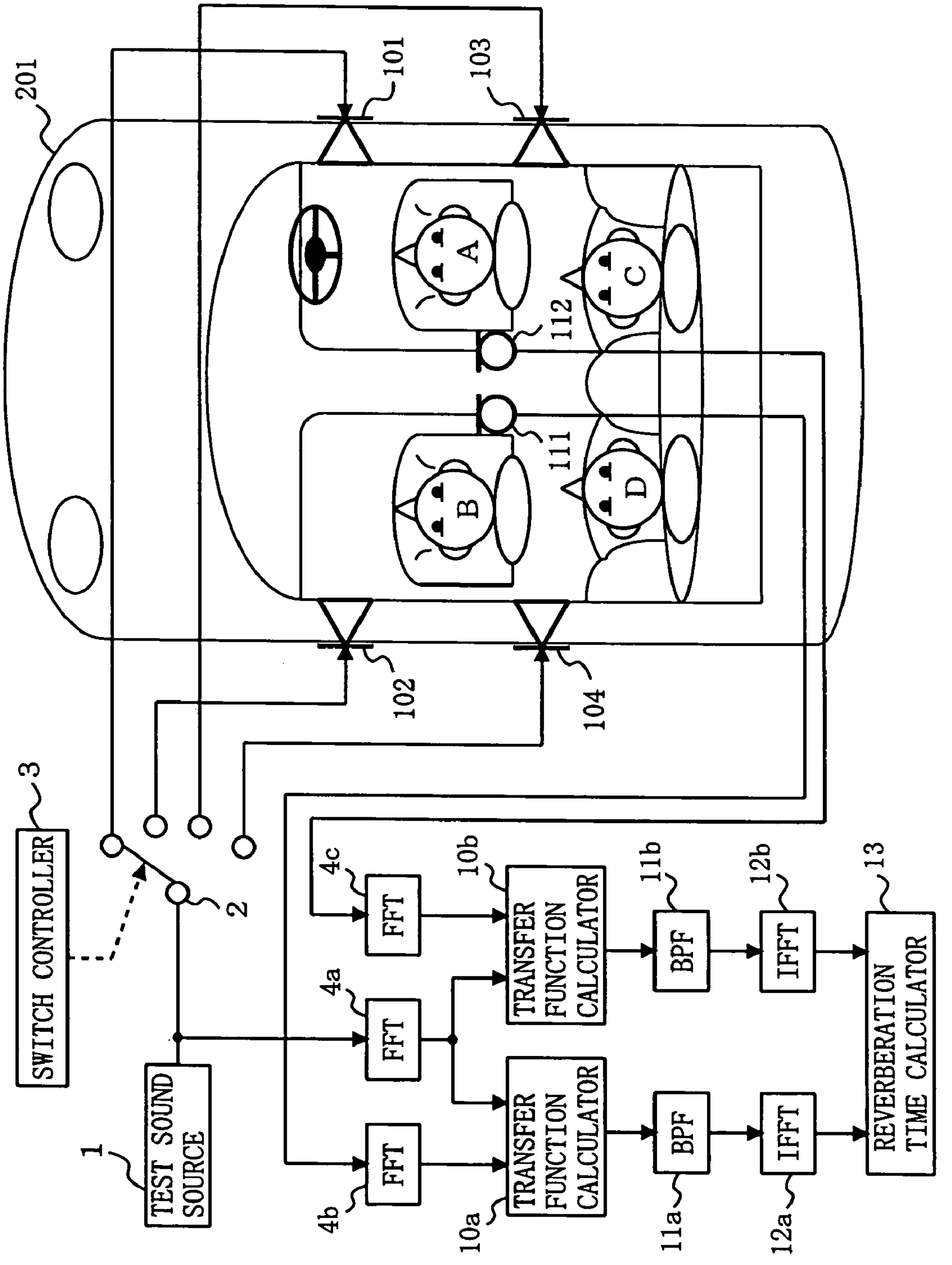
FIG. 4 shows the general configuration of a sound field measurement device according to Embodiment 2 of the present invention.

FIG. 4 shows a sound field measurement device according to Embodiment 2 of the present invention. Referring to FIG. 4, reference numeral 1 denotes a test sound source, 2 a switch, 3 a switch controller, 4*a* to 4*c* FFTs, 10*a* and 10*b* transfer function calculators, 11*a* and 11*b* BPFs, 12*a* and 12*b* inverse fast Fourier transform (IFFT) sections, 13 a reverberation time calculator, 101 a front-right door speaker, 102 a front-left door speaker, 103 a rear-right door speaker, 104 a rear-left door speaker, 111 and 112 microphones installed on the cabin ceiling near the center of the cabin, and 201 an automobile.

The operation of the sound field measurement device will now be described with reference to FIG. 4. As the measurement operation starts, the test sound source 1 generates a wide frequency range signal. The wide frequency range signal from the test sound source 1 is inputted to the switch 2, and is passed onto a selected line according to a control signal from the switch controller 3. Then, the wide frequency range signal is outputted from one of the speakers 101 to 104. The outputted wide frequency range signal is detected by the microphones 111 and 112, and the detected signals are inputted to the FFTs 4*a* and 4*c*, respectively. The wide frequency range signal from the test sound source 1 is also inputted to the FFT 4*a*.

The FFTs 4*a* to 4*c* calculate the frequency characteristics of the input wide frequency range signal and the detected signals, and output the calculation results to the transfer function calculators 10*a* and 10*b*. The transfer function calculator 10*a* divides the detected signal from the FFT 4*b* by the wide frequency range signal from the FFT 4*a*. Similarly, the transfer function calculator 10*b* divides the detected signal from the FFT 4*c* by the wide frequency range signal from the FFT 4*a*.

If the switch 2 is in the position as shown in FIG. 1, for example, and the wide frequency range signal is outputted from the speaker 101, the transfer function $H_{101\text{-}111}(\omega)$ between the speaker 101 and the microphone 111 and the transfer function $H_{101\text{-}112}(\omega)$ between the speaker 101 and the microphone 112 are as shown in the following expressions.

$$H_{101\text{-}111}(\omega)=Y_{101\text{-}111}(\omega)/X(\omega) \quad \text{(Expression 17)}$$

$$H_{101\text{-}112}(\omega)=Y_{101\text{-}112}(\omega)/X(\omega) \quad \text{(Expression 18)}$$

where $Y_{101\text{-}111}(\omega)$ is the signal detected at the microphone 111 and outputted from the FFT 4*b*, $Y_{101\text{-}112}(\omega)$ is the signal detected at the microphone 112 and outputted from the FFT 4*c*, and $X(\omega)$ is the wide frequency range signal outputted from the FFT 4*a*.

The transfer functions obtained by Expressions 17 and 18 are inputted to the BPFs 11*a* and 11*b* so as to limit the frequency components to those necessary for subsequent calculations. Where the reverberation time is to be obtained, the pass bands of the BPFs 11*a* and 11*b* can be set to 2 kHz to 6 kHz, for example. Where the characteristics of the BPFs 11*a* and 11*b* can be represented as $G(\omega)$, the outputs from the BPFs 11*a* and 11*b* are $G(\omega)H_{101\text{-}111}(\omega)$ and $G(\omega)H_{101\text{-}112}(\omega)$, respectively.

The transfer functions $G(\omega)H_{101\text{-}111}(\omega)$ and $G(\omega)H_{101\text{-}112}(\omega)$, whose bands have been limited by the BPFs 11*a* and 11*b*, are inputted to the IFFTs 12*a* and 12*b*, where they are taken back from the frequency domain to the time domain through the inverse Fourier transform. That is, the impulse responses $I_{101\text{-}111}(t)$ and $I_{101\text{-}112}(t)$ are calculated as shown in the following expressions.

$$I_{101\text{-}111}(t)=IFFT\{G(\omega)H_{101\text{-}111}(\omega)\} \quad \text{(Expression 19)}$$

$$I_{101\text{-}112}(t)=IFFT\{G(\omega)H_{101\text{-}112}(\omega)\} \quad \text{(Expression 20)}$$

The results are inputted to the reverberation time calculator 13. The reverberation time calculator 13 calculates the reverberation time from the impulse responses. The reverberation time is normally defined as the amount of time from when steady-state test sound is generated and stopped until the sound strength attenuates by 60 dB (W. C. Sabine). With this method, however, the types of test sound sources that can be used are limited, and the influence of the measurement environment, particularly the S/N ratio, is significant. Therefore, methods for obtaining the reverberation time using impulse responses have also been used in the art.

Typically, a reverberation attenuation waveform can be obtained from the Schroeder's integration formula, and the reverberation time can be determined based on the gradient of the waveform. This can be applied to Expressions 19 and 20 to yield the following expressions.

$$\int_t^\infty I_{101\text{-}111}^2(t)dt=\int_0^\infty I_{101\text{-}111}^2(t)dt-\int_0^t I_{101\text{-}111}^2(t)dt$$

$$\int_t^\infty I_{101\text{-}112}^2(t)dt=\int_0^\infty I_{101\text{-}112}^2(t)dt-\int_0^t I_{101\text{-}112}^2(t)dt$$

A reverberation attenuation waveform can be obtained from each of these expressions, and the reverberation time can be determined based on the gradient thereof. The reverberation time calculator 13 obtains the reverberation time for each of the signals detected by the microphones 111 and 112, and the average thereof can be obtained as the final reverberation time for the speaker 101.

Figure 5:
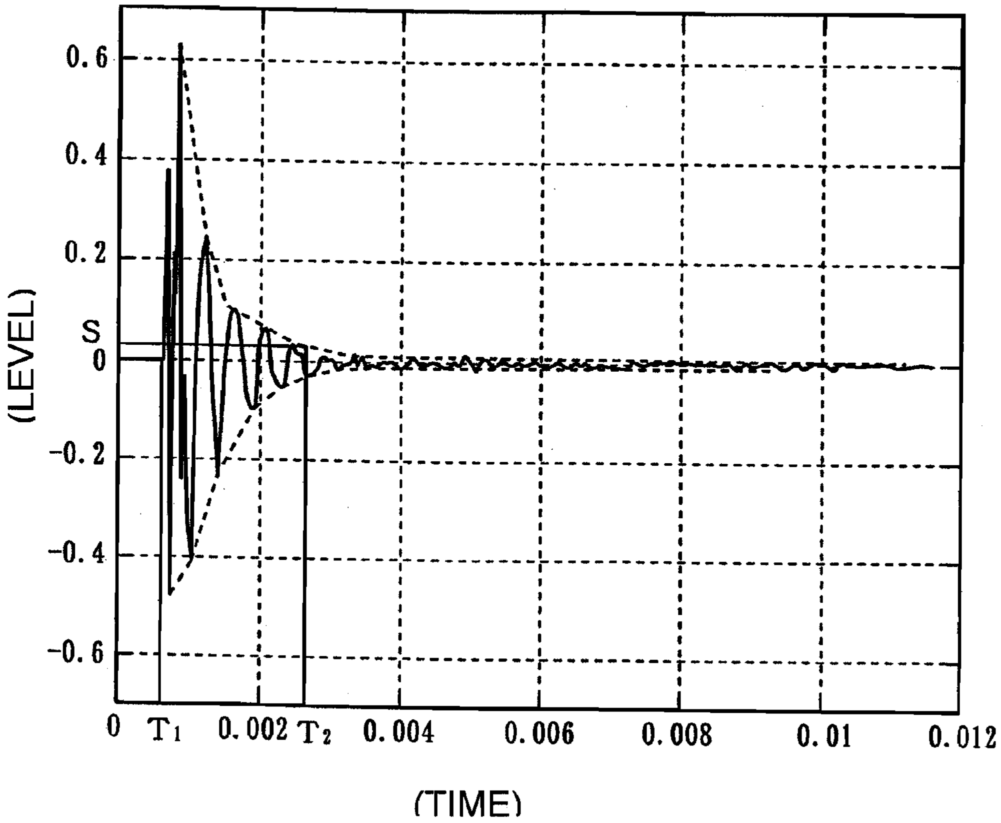
FIG. 5 shows an impulse response.

Another approach is, for example, to calculate the envelope (dotted line) of the obtained impulse response, as shown in FIG. 5, and obtains the reverberation time as the difference T2−T1 between time T2 at which the threshold value S is reached and the rise T1 of the impulse response.

While the threshold value S is set only on the positive side in the illustrated example, it may alternatively be set on the negative side or on both sides. In a case where threshold values are set both on the positive side and on the negative side, the threshold values may be reached at different points in time, in which case time T2 can be obtained as the average between these points in time.

Alternatively, the absolute value of each sample value of the impulse response can be obtained, or each sample value can be squared, so that the impulse response curve is drawn only on the positive side, after which the envelope can be calculated.

Figure 6A:
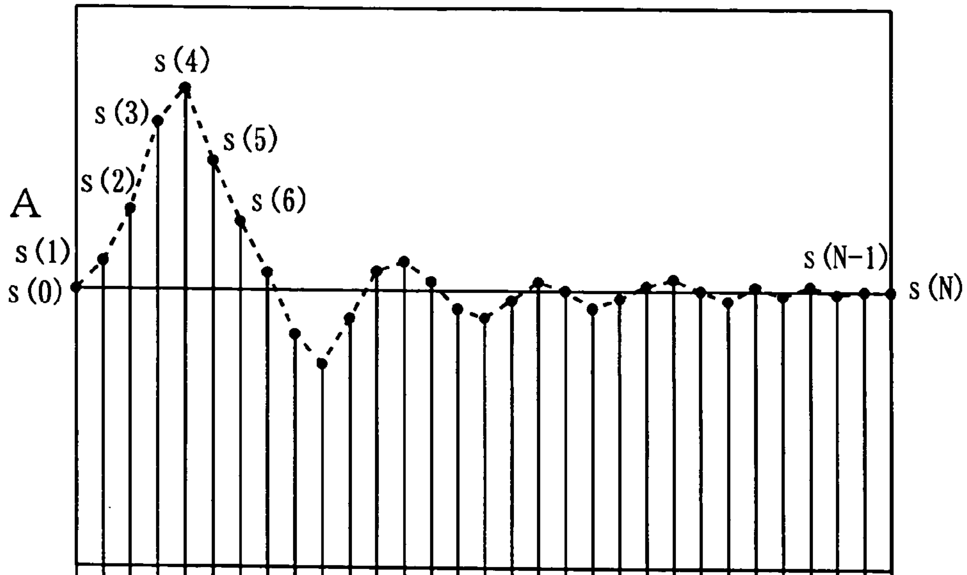
FIGS. 6A and 6B show an impulse response and a reverberation attenuation waveform, respectively.

Still another approach will be described with reference to FIGS. 6A and 6B. FIG. 6A shows an impulse response (dotted line), with each circular dot representing a sample point. Each sample value is squared, and the squared sample values are summed for each sample point starting from the sample point and ending at the last sample point N of the impulse response, thereby obtaining a reverberation attenuation waveform. Specifically, where s(0), s(1), s(2), . . . , s(N−1) and s(N) denote the sample values of the impulse response shown in FIG. 6A, the sample values can be summed for each sample point as shown in the following expressions.

$$n=0 \quad \sum_{n=0}^{N} s^2(n) = s^2(0) + s^2(1) + \cdots + s^2(N-1) + s^2(N)$$

$$n=1 \quad \sum_{n=1}^{N} s^2(n) = s^2(1) + s^2(2) + \cdots + s^2(N-1) + s^2(N)$$

$$\vdots$$

$$n=N-1 \quad \sum_{n=N-1}^{N} s^2(n) = s^2(N-1) + s^2(N)$$

$$n=N \quad \sum_{n=N}^{N} s^2(n) = s^2(N)$$

Figure 6B:
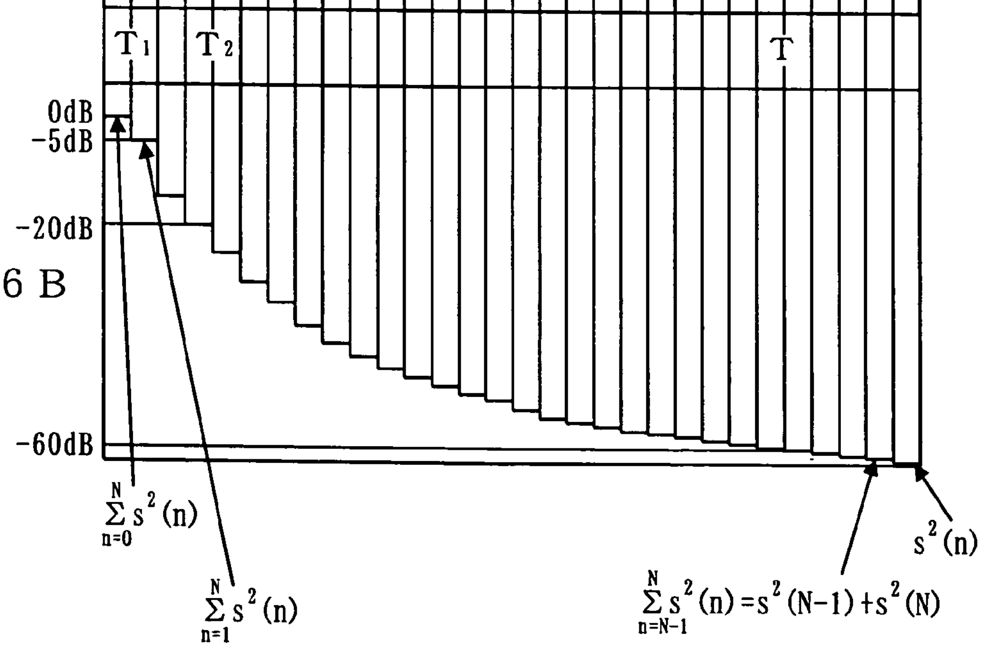

Then, a graph as shown in FIG. 6B is obtained based on the calculated sums. Thus, the reverberation time can be obtained as time T at which the level reaches −60 dB along the obtained attenuation waveform.

However, the S/N ratio around −60 dB is often quite poor due to the influence of the background noise in the sound field. In view of this, the reverberation time maybe obtained by obtaining the difference T2−T1 between time T1 corresponding to −5 dB and time T2 corresponding to −20 dB, and then multiplying the difference by 4 as shown in the following expression.

$$\text{Reverberation time}=4(T2-T1) \qquad \text{(Expression 21)}$$

Thus, it is possible to prevent the influence of the S/N ratio deterioration and to obtain the reverberation time with a high precision.

Note that the final reverberation time for the speaker 101 is obtained as the average of the reverberation times for signals detected by the microphone 111 and the microphone 112.

The reverberation time for the speaker 101 is obtained based on the impulse response characteristics of the microphones 111 and 112 in response to a test sound from the speaker 101, as described above. The reverberation time for each of the speakers 102 to 104 is similarly obtained. Then, the sound field measurement device obtains the final reverberation time as the average of the reverberation characteristics for the speakers 101 to 104.

The wide frequency range signal may be a test signal, including an impulse signal, a random (or burst random) signal such as white noise or pink noise, a sweep pulse signal (chirp signal). Alternatively, the wide frequency range signal may be a series of musical tones including a piano scale or a plurality of chords, or a music signal. In such a case, the switch controller 3 switches the position of the switch 2 from one to another at an appropriate time taking into consideration the frequency variation of the wide frequency range signal such as a music signal, so that a sufficiently wide frequency range is included in the wide frequency range signal outputted from each of the speakers 101 to 104. Thus, the presence/absence of passengers can be determined even with a music signal, or the like. As a result, the wide frequency range test signal outputted from the speakers 101 to 104 will not make the passengers in the cabin of the automobile 201 feel uncomfortable or annoyed.

In a sound field having complicated acoustic characteristics such as the cabin of the automobile 201, it is preferred that the averaging operation is used in the calculation of the frequency characteristics at the FFTs 4*a* to 4*c*, so that stable characteristics can be obtained. However, in a sound field having more straightforward acoustic characteristics, the averaging operation may be omitted.

While the pass band of the BPFs 11*a* and 11*b* is set to 2 kHz to 6 kHz in the present embodiment, the present invention is not limited to this. The pass band may be widened. It should be noted however that if the pass band is widened in the lower frequency direction, the response will be longer, thereby increasing the computational load. Also if the passband is widened in the higher frequency direction, the amount of information to be processed will increase, thereby increasing the computational load. Therefore, the BPF characteristics should practically be determined so that the reverberation characteristics can be determined while limiting the frequency range to a degree such that it does not impose an undue computational load.

Figure 7:
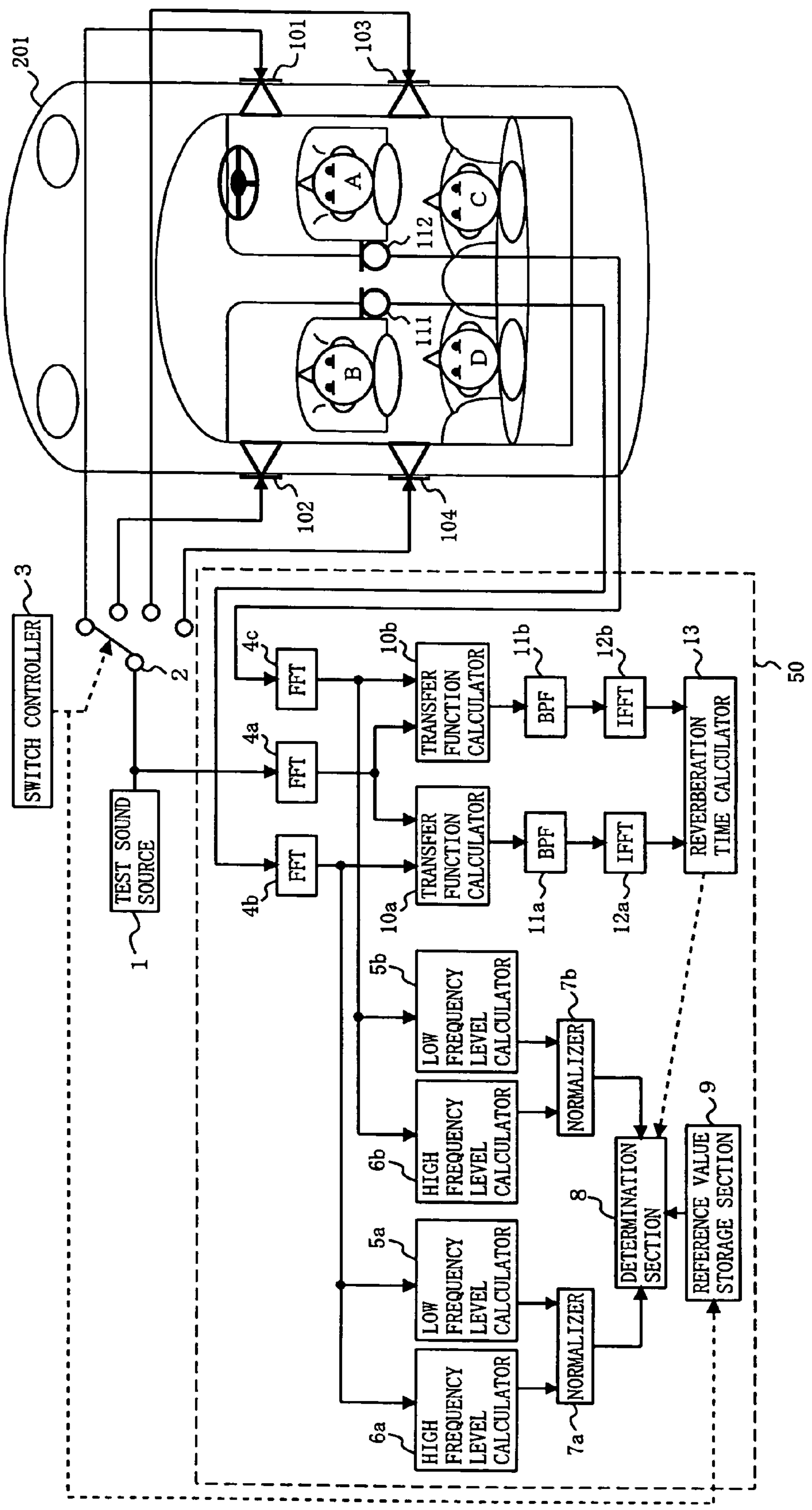
FIG. 7 shows the general configuration of a sound field measurement device of the present invention where the passenger detection and the reverberation time measurement are performed at the same time.

Without using the BPFs 11*a* and 11*b*, effects similar to those described above can be obtained by, for example, subjecting the wide frequency range signal from the test sound source 1 to a band filtering operation in advance. Where the present embodiment is combined with the passenger detection described above in Embodiment 1, it is possible, with the use of the BPFs 11*a* and 11*b* shown in FIG. 4, to determine the presence/absence of passengers while measuring the reverberation characteristics at the same time using the same wide frequency range signal. In such a case, the sound field measurement device will be configured as shown in FIG. 7. A section in FIG. 7 that is delimited by a broken line will be referred to as a measurement section 50 in Embodiment 4 to be described below.

While the speakers 101 to 104 are installed in the doors inside the cabin in the present embodiment, the present invention is not limited to this.

While the microphones 111 and 112 are installed on the cabin ceiling near the center of the cabin in the present embodiment, the present invention is not limited to this. In other embodiments, the microphones 111 and 112 may be installed on top of the seat back of the driver's seat or the front passenger's seat near the center of the cabin, around the sun visor of the driver's seat, or around the rear-view mirror, as shown in FIG. 2.

Since a human is normally a sound absorber, the reverberation time is shortened by the presence of a passenger. Therefore, the speakers and the microphones are preferably installed at positions such that the acoustic characteristics in the high frequency range between a speaker and the microphones is influenced by the presence/absence of a passenger. Then, it can also be used for detecting the presence/absence of passengers. In such a case, the calculation result from the reverberation time calculator 13 can be inputted to the determination section 8 as shown in FIG. 7. The determination section 8 can more accurately determine the presence/absence of a passenger by additionally taking into consideration the reverberation time from the reverberation time calculator 13.

While two microphones are used in the present embodiment, the present invention is not limited to this. If the number of microphones is increased, the amount of information to be obtained is also increased, thereby improving the precision of the reverberation characteristics measurement.

While the present embodiment is directed to a measurement method for measuring the reverberation time of the cabin of the automobile 201, the present invention is not limited to the measurement inside an automobile cabin, as already noted above in Embodiment 1.

Embodiment 3

Figure 8:
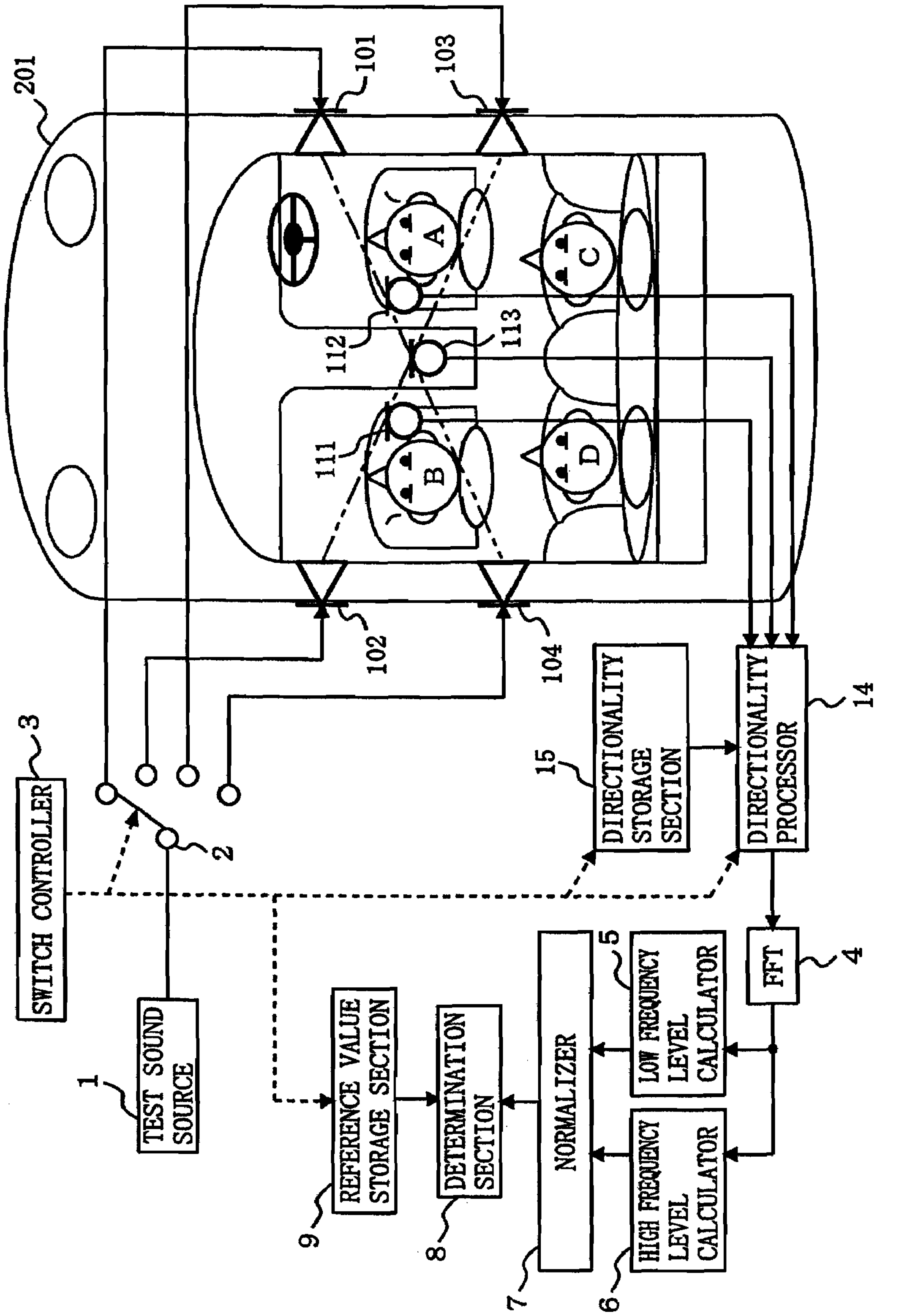
FIG. 8 shows the general configuration of a sound field measurement device according to Embodiment 3 of the present invention.

FIG. 8 shows a sound field measurement device according to Embodiment 3 of the present invention. Referring to FIG. 8, reference numeral 1 denotes a test sound source, 2 a switch, 3 a switch controller, 4 an FFT, 5 a low frequency range level calculator, 6 a high frequency range level calculator, 7 a normalizer, 8 a determination section, 9 a reference value storage section, 14*a* directionality processor, 15*a* directionality storage section, 101 a front-right door speaker, 102 a front-left door speaker, 103*a* rear-right door speaker, 104*a* rear-left door speaker, 111 to 113 microphones installed on the cabin ceiling near the center of the cabin, and 201 an automobile.

The operation of the sound field measurement device will now be described with reference to FIG. 8. As the measurement operation starts, the test sound source 1 generates a wide frequency range signal. The wide frequency range signal from the test sound source 1 is inputted to the switch 2, and is passed onto a selected line according to a control signal from the switch controller 3. Then, the wide frequency range signal is outputted from one of the speakers 101 to 104. The outputted wide frequency range signal is detected by the microphones 111 to 113, the detected signals are inputted to the directionality processor 14. At the same time, the directionality processor 14 receives a directionality pattern from the directionality storage section 15 depending on the position of the switch 2 controlled by the switch controller 3.

For example, where the switch 2 is positioned as shown in FIG. 8 and the wide frequency range signal is outputted from the speaker 101, the directionality storage section 15 outputs a directionality pattern that is strengthened in the direction toward the speaker 110. The detected signals from the microphones 111 to 113 are processed with the directionality pattern so as to more strongly extract particular components of the received acoustic characteristics that are in the direction toward the speaker 101. Thus, it is possible to remove components unnecessary for the detection of Passenger A, such as reflections coming in directions other than from the speaker 101, thereby improving the detection precision.

Figure 9:
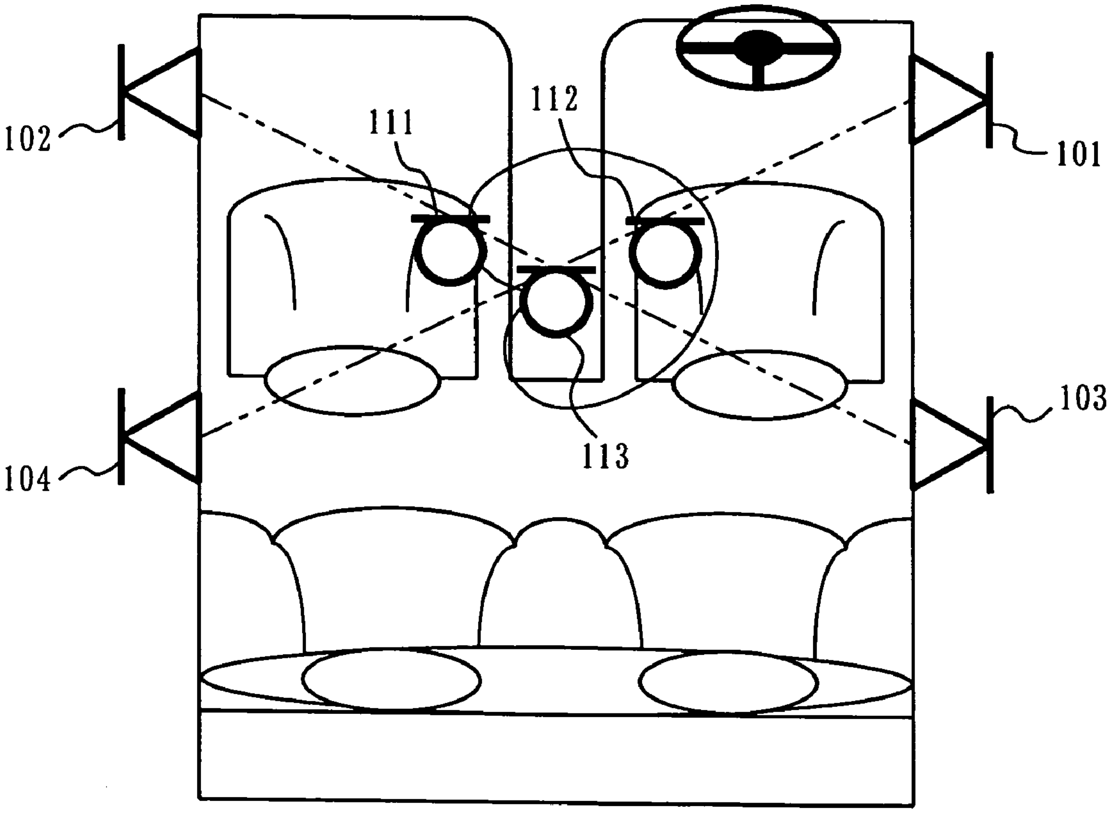
FIG. 9 shows an arrangement of speakers and microphones, and a directionality pattern.

The microphones 112 and 113 are positioned along a straight line (two-dot chain line) between the speakers 101 and 104 (i.e., a diagonal line of a rectangular shape defined by the speakers 101 to 104 being the vertices), and the microphones 111 and 113 are positioned along a straight line (two-dot chain line) between the speakers 102 and 103. The microphone 113 is positioned at the intersection between these diagonal lines. With such a microphone arrangement, it is possible to provide, with the microphones 112 and 113, a directionality pattern strengthened in the direction toward the speaker 101, being active, as shown in FIG. 9. After the switch 2 is turned to another position so as to activate the speaker 102, it is possible to provide, with the microphones 111 and 113, another directionality pattern that is strengthened in the direction toward the speaker 102. While this is a principle already known in the art, it will be illustrated with reference to FIGS. 10A to 10D.

Figure 10A:
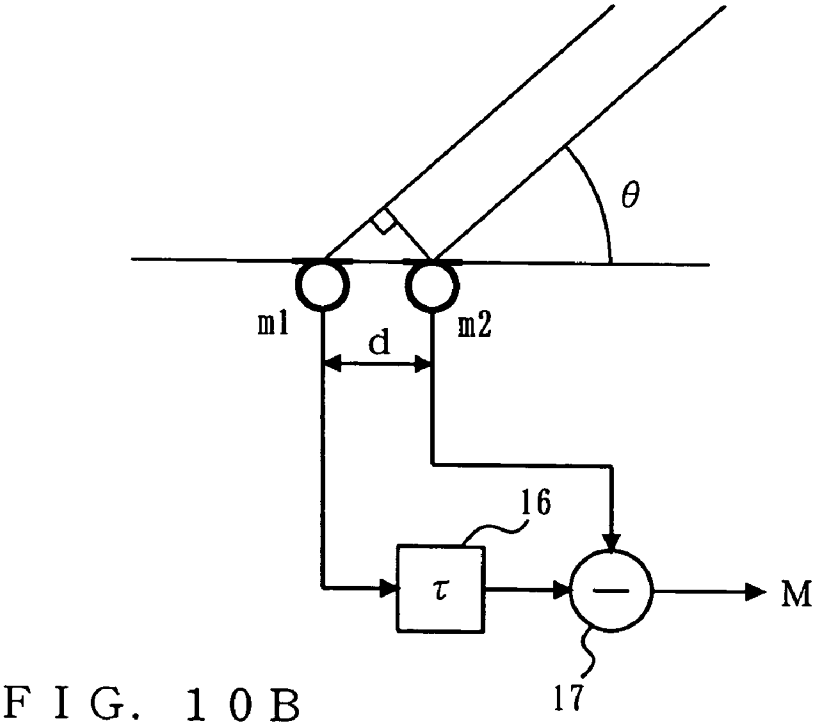
FIGS. 10A to 10D show the principle of the directionality control.

Referring to FIG. 10A, where a sound signal is incident on microphones m1 and m2 at an angle of θ, the delay time T caused due to the path difference d is as shown in the following expression.

$$T=d\cdot\cos\theta/c\,(c\text{: the speed of sound}) \quad \text{(Expression 22)}$$

The output from the microphone ml is delayed by time τ at the delay element 16, and it is subtracted from the output from the microphone m2 at the subtractor 17. Assuming that the microphones m1 and m2 have an equal characteristics value (being m), the output M from the subtractor 17 is as shown in the following expression.

$$M=m\{1-\exp(-j\omega(\tau+d\cos\theta/c))\} \quad \text{(Expression 23)}$$

Expression 23 shows that the output M varies depending on the value τ.

Figure 10B:
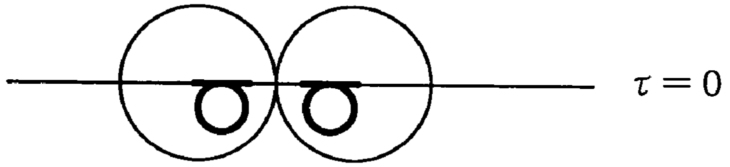

FIG. 10B shows a case where τ=0. In this case, the output M is minimized at θ=±π/2 and maximized at θ=0 or θ=π, thus resulting in a bidirectional pattern as shown in FIG. 10B.

Figure 10C:
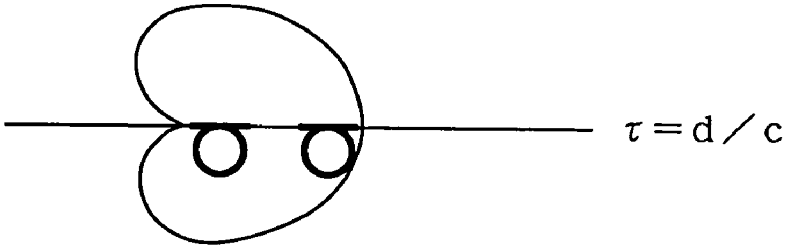

FIG. 10C shows a case where τ=d/c. In this case, the output M is minimized at θ=π and maximized at θ=0, thus resulting in a unidirectional pattern as shown in FIG. 10C.

Figure 10D:
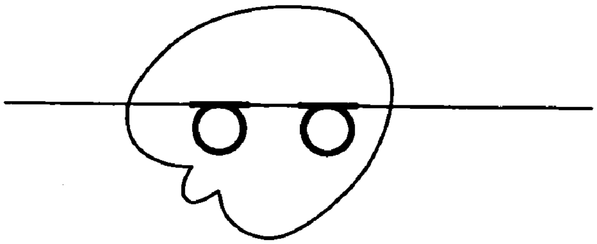

Accordingly, a different directionality pattern as shown in FIG. 10D may also be obtained by setting the value τ to an appropriate value in between.

Figure 11A:
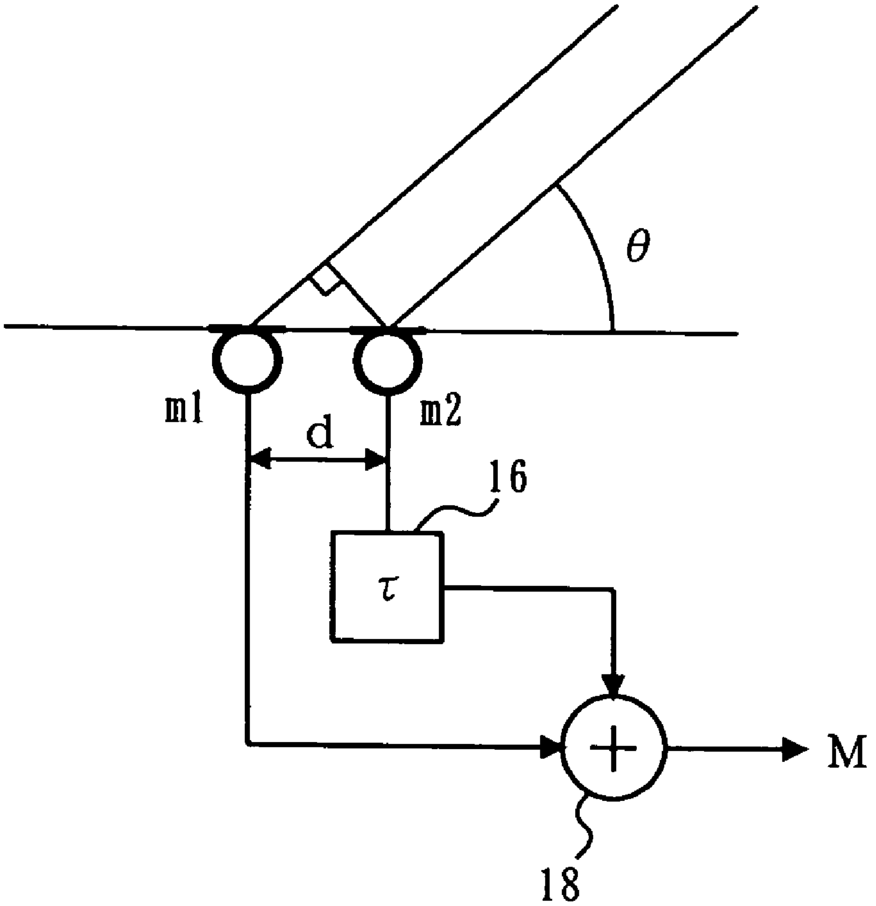
FIGS. 11A and 11B show the principle of the directionality control.

With an arrangement as shown in FIG. 11A, the output M of the adder 18 is as shown in the following expression.

$$M=m\{\exp(-j\omega\tau+\exp(-j\omega\tau d\cos\theta/c)) \quad \text{(Expression 24)}$$

Figure 11B:
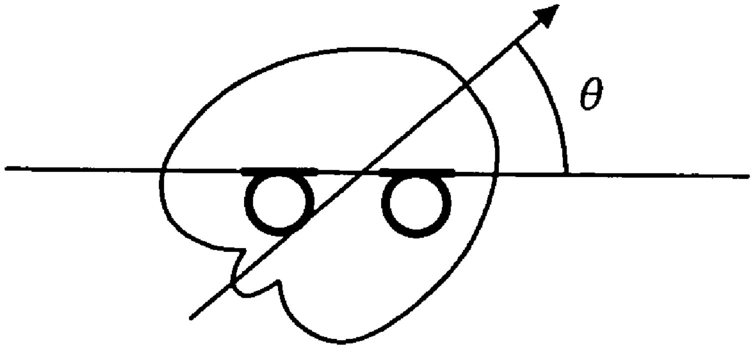

Thus, a directionality pattern that is most strengthened in a direction θ is obtained when τ=d cos θ/c, as shown in FIG. 11B. The method of adjusting a directionality pattern may be either the one shown in FIGS. 10A to 10D or that shown in FIGS. 11A and 11B.

As described above, the directionality processor 14 provides a directionality pattern as shown in FIG. 9 while the wide frequency range signal is being outputted from the speaker 101, whereby it is possible to detect the wide frequency range signal from the speaker 101 with a high precision.

Figure 12:
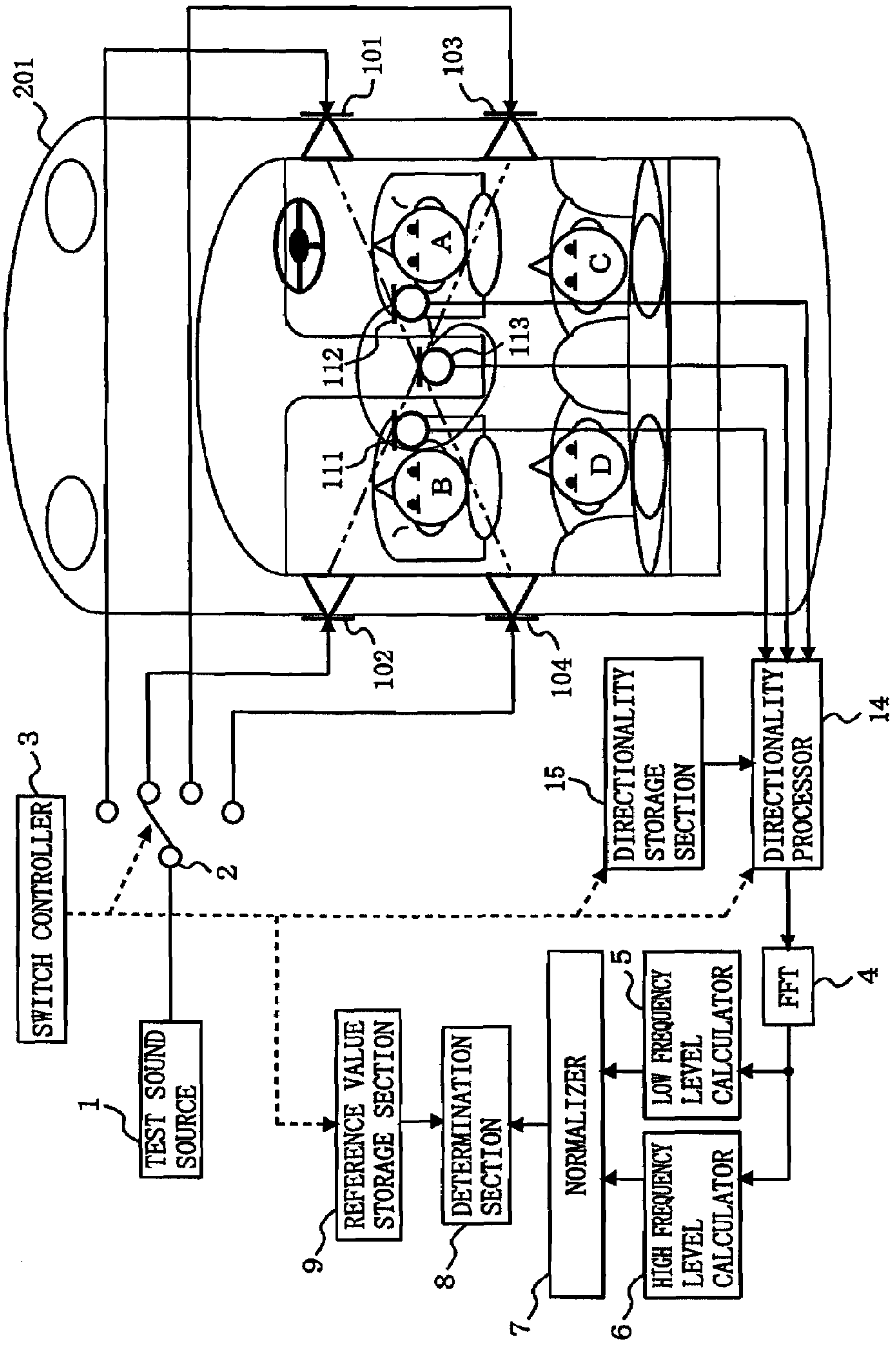
FIG. 12 shows the general configuration of a sound field measurement device according to Embodiment 3 of the present invention.

Similarly, where the wide frequency range signal is outputted from the speaker 102, the directionality processor 14 provides a directionality pattern as shown in FIG. 12, whereby the wide frequency range signal from the speaker 102 can be detected with a high precision by the microphones 111 and 113.

Figure 13:
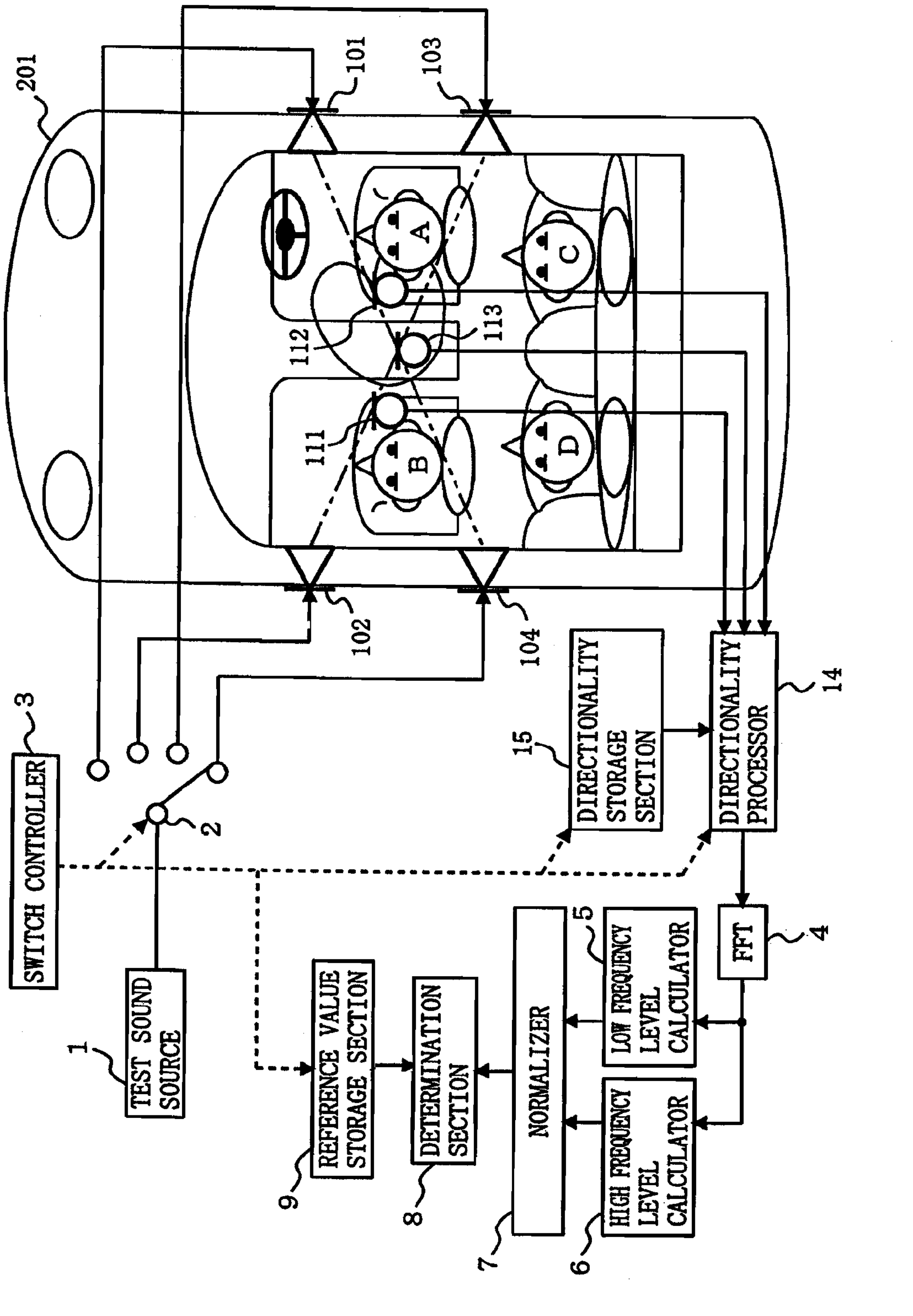
FIG. 13 shows the general configuration of a sound field measurement device according to Embodiment 3 of the present invention.

Similarly, where the wide frequency range signal is outputted from the speaker 104, the directionality processor 14 provides a directionality pattern as shown in FIG. 13, whereby the wide frequency range signal from the speaker 104 can be detected with a high precision by the microphones 112 and 113.

Thus, with the microphone arrangement where the microphones 111 to 113 are positioned along the diagonal lines of a rectangular shape defined by the speakers 101 to 104, it is possible to provide a directionality pattern toward any of the speakers 101 to 104.

The signal processed by the directionality processor 14 is inputted to the FFT 4. Thereafter, the process is similar to that of Embodiment 1, and will not be further described below.

In the present embodiment, with the provision of the directionality processor 14, it is possible to detect the wide frequency range signal from an intended speaker with a high precision. Therefore, it is possible to improve the precision in the final determination of the presence/absence and the position of a passenger at the determination section 8.

While three microphones are used in the present embodiment, the present invention is not limited to this. With more microphones, it is possible to provide a more distinct directionality pattern. The microphones are typically lined up in a direction in which the directionality pattern is intended to be strengthened.

While the microphones are installed on the cabin ceiling near the center of the cabin in the present embodiment, the present invention is not limited to this. In other embodiments, the microphones may be installed in other positions as shown in FIG. 2. In such a case, it is necessary to adjust the directionality pattern by appropriately adjusting the value of the delay element 16 of FIGS. 10A to 10D or FIGS. 11A and 11B.

Figure 14:
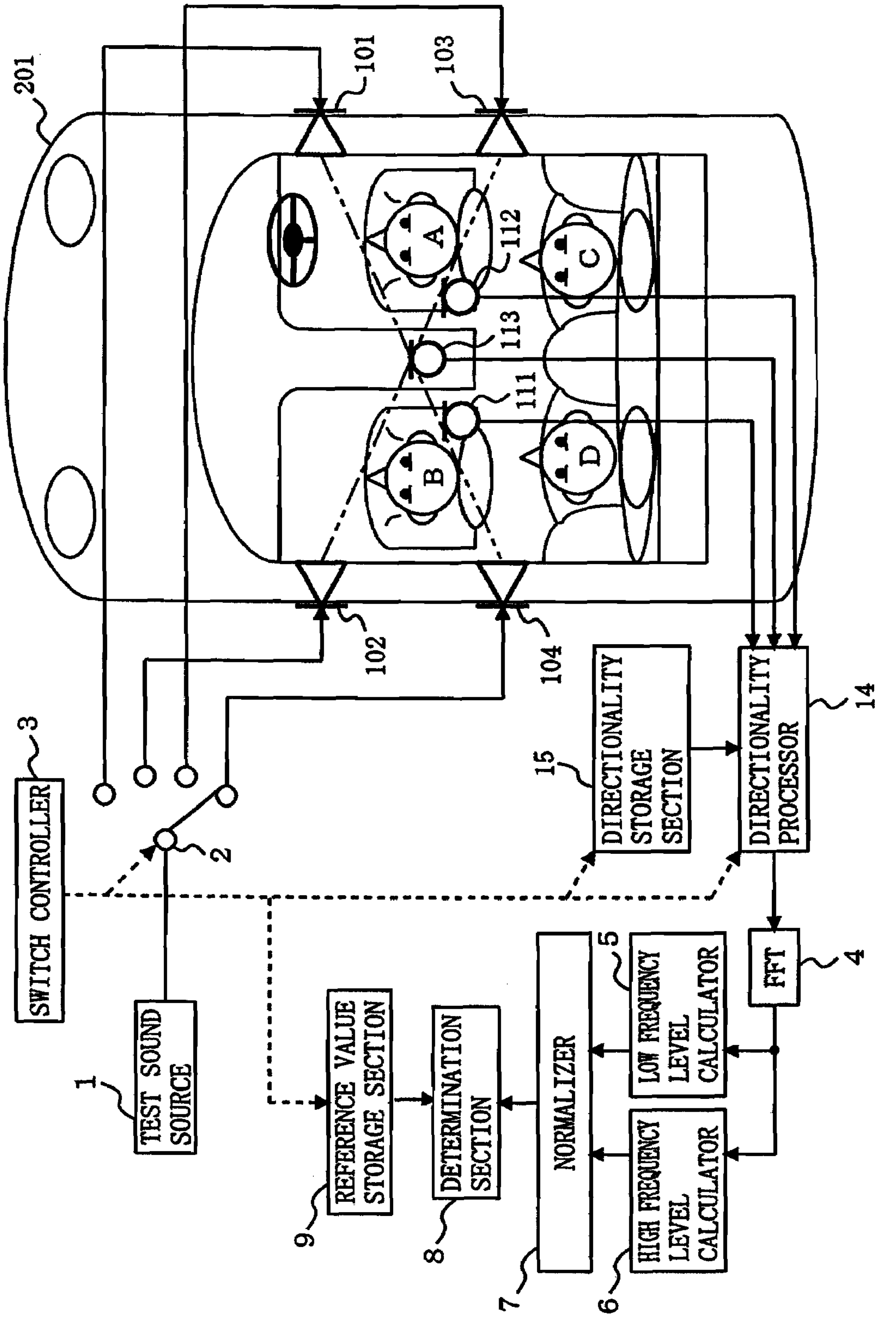
FIG. 14 shows the general configuration of a sound field measurement device according to Embodiment 3 of the present invention.

It should be clear from the description above that similar directionality patterns can be obtained also when the microphones 111 and 112 are installed on the rear side of the microphone 113 as shown in FIG. 14.

While the directionality pattern is controlled in connection with the control of the switch 2 in the present embodiment, the present invention is not limited to this. While an intended directionality pattern is realized by processing the detection results obtained from the microphones 111 to 113 as shown in FIGS. 10A to 10D or FIGS. 11A and 11B in the present embodiment, this process can be performed at any subsequent time once the detection results obtained from the microphones 111 to 113 are stored in a storage device.

Embodiment 4

Figure 15:
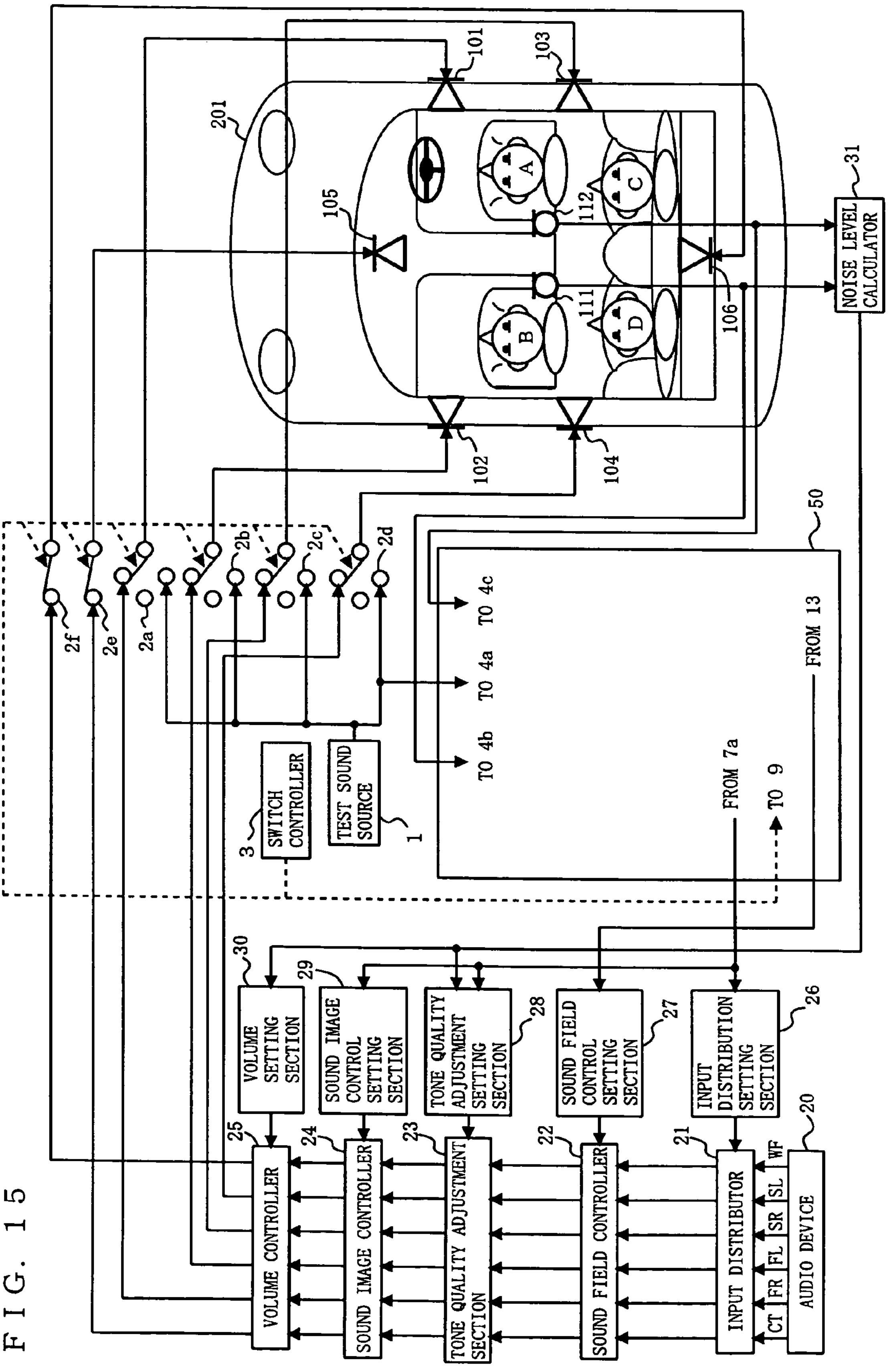
FIG. 15 shows the general configuration of a sound field measurement device according to Embodiment 4 of the present invention.

FIG. 15 shows a sound field measurement device according to Embodiment 4 of the present invention. Referring to FIG. 15, reference numeral 1 denotes a test sound source, 2*a* to 2*f* a switch, 3 a switch controller, 20 an audio device, 21 an input distributor, 22 a sound field controller, 23 a tone quality adjustment section, 24 a sound image controller, 25 a volume controller, 26 an input distribution setting section, 27 a sound field control setting section, 28 a tone quality adjustment setting section, 29 a sound image control setting section, 30 a volume setting section, 31 a noise level calculator, 50 a measurement section, 101 a front-right door speaker, 102 a front-left door speaker, 103 a rear-right door speaker, 104*a* rear-left door speaker, 105*a* speaker installed at the center of the front instrument panel, 106 a speaker installed in the rear tray, 111 and 112 microphones installed on the cabin ceiling near the center of the cabin, and 201 an automobile. The measurement section 50 is the same as that shown in FIG. 7, and is thus simplified in FIG. 15.

The operation of the sound field measurement device will now be described with reference to FIG. 15. As the measurement operation starts, the test sound source 1 generates a wide frequency range signal. The wide frequency range signal from the test sound source 1 is inputted to the switches 2*a* to 2*d*. Moreover, signals outputted from the audio device 20 are inputted to the switches 2*a* to 2*f* via the input distributor 21, the sound field controller 22, the tone quality adjustment section 23, the sound image controller 24 and the volume controller 25.

The switch controller 3 controls the switches 2*a* to 2*d* so that the wide frequency range signal from the test sound source 1, a signal from the volume controller 25, or neither of them, is selectively outputted through each of the switches 2*a* to 2*d*. The switch controller 3 also controls the switches 2*e* and 2*f* so that a signal from the volume controller 25 is selectively outputted or not outputted through each of the switches 2*e* and 2*f*. Where any one of the switches 2*a* to 2*d* is turned to a position where the wide frequency range signal from the test sound source 1 is allowed to be outputted therethrough, the subsequent operation will be the same as that described above in Embodiments 1 to 3, which will not be further described below.

The operation to be performed when the switches 2*a* to 2*f* are positioned so that signals from the volume controller 25 are allowed to be outputted therethrough will now be described.

The sound field measurement is performed as in Embodiments 1 to 3, whereby the determination section 8 obtains the number and positions of passengers. According to the obtained results, the input distribution setting section 26 sets, in the input distributor 21, which channel of input signal is to be outputted to which output channel at which level. Similarly, the tone quality adjustment setting section 28 sets, in the tone quality adjustment section 23, parameters for adjusting the frequency characteristics of each channel of input signal according to the obtained results. Similarly, the sound image control setting section 29 sets, in the sound image controller 24, parameters for controlling the sound image according to the obtained results.

Similarly, the sound field control setting section 27 sets, in the sound field controller 22, parameters for setting appropriate early reflections and reverberations according to the results obtained by the reverberation time calculator 13.

Moreover, the noise level in the cabin of the automobile 201 is obtained by the microphones 111 and 112 and the noise level calculator 31. According to the obtained noise level, the tone quality adjustment setting section 28 sets appropriate parameters in the tone quality adjustment section 23, and the volume setting section 30 sets an appropriate volume level in the volume controller 25.

Thus, appropriate parameters are set in the input distributor 21, the sound field controller 22, the tone quality adjustment section 23, the sound image controller 24 and the volume controller 25, after which the audio device 20 such as a DVD player, for example, is operated. Then, different channels of input signal (a CT signal, an FR signal an FL signal, an SR signal, an SL signal and a WF signal) are appropriately distributed by the input distributor 21 according to the positions where passengers are present. For example, where only a passenger is present in a front seat, the FL signal and the FR signal can be outputted only from the speakers 102 and 101, respectively. However, where another passenger is present in a back seat, these signals should be outputted also from the speakers 104 and 103, respectively. Thus, appropriate adjustments are made as necessary.

Then, the sound field controller 22 controls the sound field. Specifically, the sound field controller 22 may, for example, expand the sound field, control the sense of distance or simulate a particular sound field by, for example, adding early reflections and reverberations to each channel of signal being received. Since a human is basically a sound absorber, the reverberation time varies depending on the number of people present in the cabin. The reverberation time of a sound field decreases as the number of people present therein increases. The variations in the reverberation time are compensated for by the sound field controller 22. Thus, audio signals are always reproduced with an appropriate reverberation time, irrespective of the number of passengers. Moreover, since the reverberation time is detected in the present invention, audio signals can be reproduced while optimally adjusting the reverberation time even in the presence of a non-human object that influences the reverberation characteristics of the cabin (e.g., a coat, a cushion, etc.). Furthermore, while a person purchasing the automobile 201 can choose an interior material from among different materials at the time of the purchase, the reverberation characteristics of the cabin of the automobile 201 may vary depending on the type of interior material to be selected. Such variations can also be compensated for by the present invention.

Figure 16A:
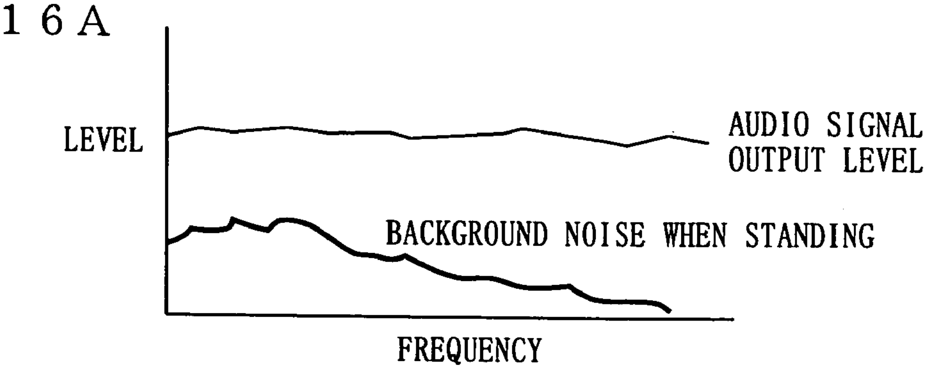
FIGS. 16A to 16D show a method for adjusting the audio signal output level.
Figure 16B:
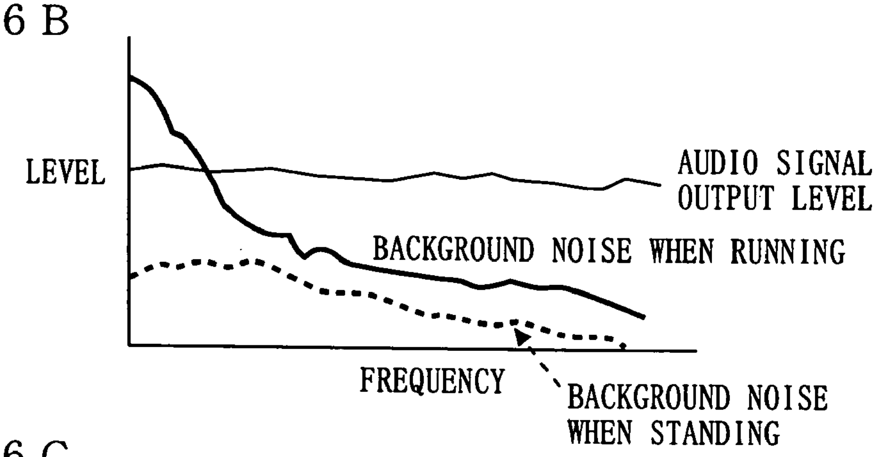
Figure 16C:
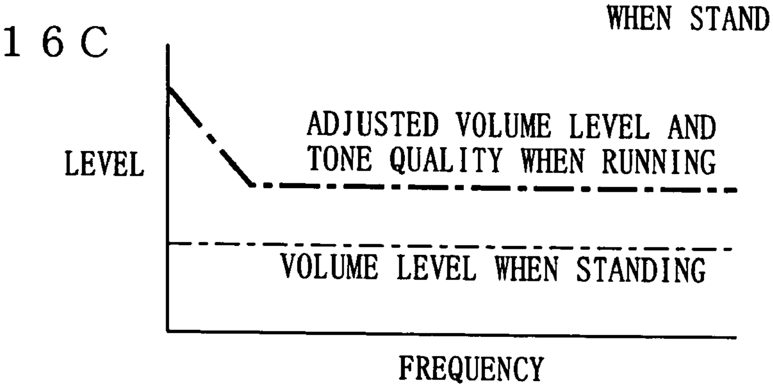
Figure 16D:
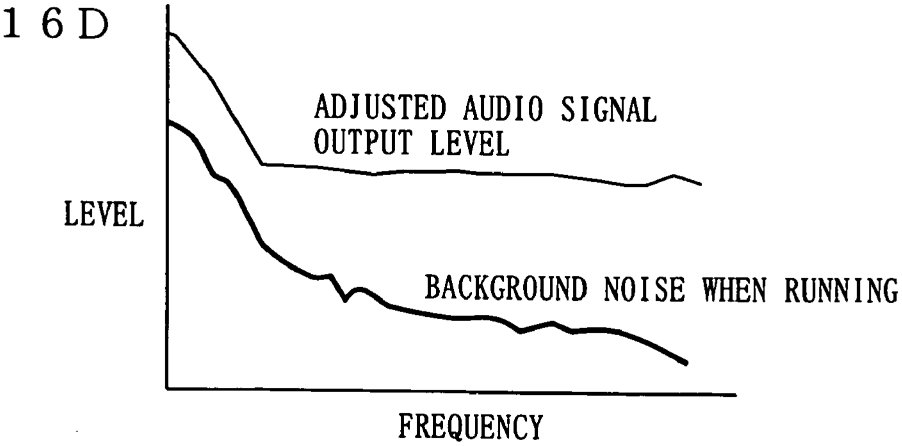

The tone quality adjustment section 23 may include an equalizer or a tone quality controller for realizing an intended tone quality by adjusting the frequency characteristics of the speakers 101 to 106, and optimally adjusts the input signal characteristics according to the positions of passengers obtained by the determination section 8. The tone quality adjustment section 23 also functions to change the frequency characteristics of the input signal according to the noise level obtained by the noise level calculator 31. Moreover, the volume level is adjusted at the volume controller 25 according to the noise level obtained by the noise level calculator 31. These adjustments will now be described with reference to FIGS. 16A to 16D. FIG. 16A shows the audio signal output level (thin solid line) and the background noise level (thick solid line) while the automobile 201 is standing still. As indicated, while the automobile 201 is standing still, the background noise level is low, whereby a sufficient S/N ratio is ensured. FIG. 16B shows the unadjusted audio signal output level (thin solid line and broken line) and the background noise level (thick solid line) while the automobile 201 is running. FIG. 16B also shows, for reference, the background noise level (thick broken line) while the automobile 201 is standing still. When the automobile 201 is running, the background noise level increases across the entire frequency range, and the change is particularly significant in the low frequency range, which is difficult to insulate. As a result, the audio signal is masked by the driving noise in the low frequency range as shown by a thin broken line. Although the audio signal is not masked in the mid-to-high frequency range, the S/N ratio thereof is poorer than when the automobile 201 is standing still. Therefore, the frequency characteristics are adjusted as shown by a thick one-dot chain line in FIG. 16C according to the noise level obtained by the noise level calculator 31. Specifically, the volume is increased by the volume controller 25 across the entire frequency range, and the level in the low frequency range is further increased by the tone quality adjustment section 23. As a result, the audio signal is ensured a sufficient S/N ratio across the entire frequency range even in the presence of the driving noise, and is not masked by noise in the low frequency range, as shown in FIG. 16D, whereby the audio signal can be reproduced and heard well. The tone quality adjustment section 23 may make further adjustments to realize an intended tone quality according to the number and positions of passengers.

The sound image controller 24 optimally controls the sound image of each channel of signal according to the number and positions of passengers based on the determination results obtained from the determination section 8. For example, the sound image may be controlled to be optimal for the driver if only the driver is present in the automobile 201, while performing no sound image control if there is any other passenger in the automobile 201. More preferably, if there are a plurality of passengers, the sound image is controlled optimally for the arrangement of the positions of the passengers. See, for example, Japanese Patent Application No. 2002-167197, for details of such a method.

Thus, the sound field measurement is performed as described above to obtain the number and positions of passengers and the reverberation time, and the obtained information is utilized in the adjustment of the audio reproduction parameters, thereby realizing automatically optimized audio reproduction.

Figure 17:
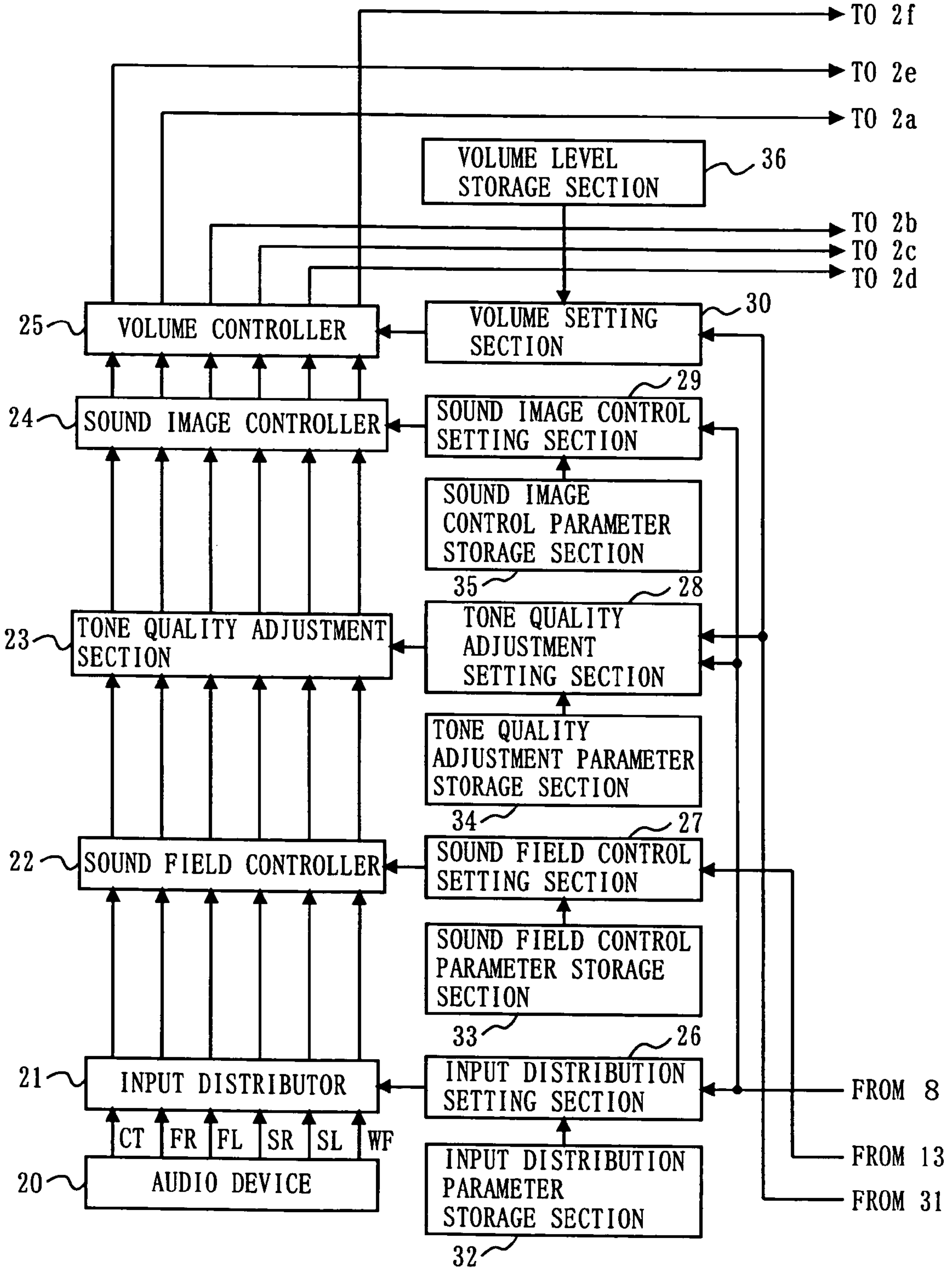
FIG. 17 shows the general configuration of a sound field measurement device according to Embodiment 4 of the present invention.

In the example shown in FIG. 15, the parameters for adjusting the audio signal are set by the input distribution setting section 26, the sound field control setting section 27, the tone quality adjustment setting section 28, the sound image control setting section 29 and the volume setting section 30. Alternatively, as shown in FIG. 17, the parameters may be stored in an input distribution parameter storage section 32, a sound field control parameter storage section 33, a tone quality adjustment parameter storage section 34, a sound image control parameter storage section 35 and a volume level storage section 36, and optimal parameters may be taken out from the storage sections according to the results of the sound field measurement. Sections other than those involved in the audio signal adjustment are not shown in FIG. 17 as they are similar to those shown in FIG. 15.

Figure 18:
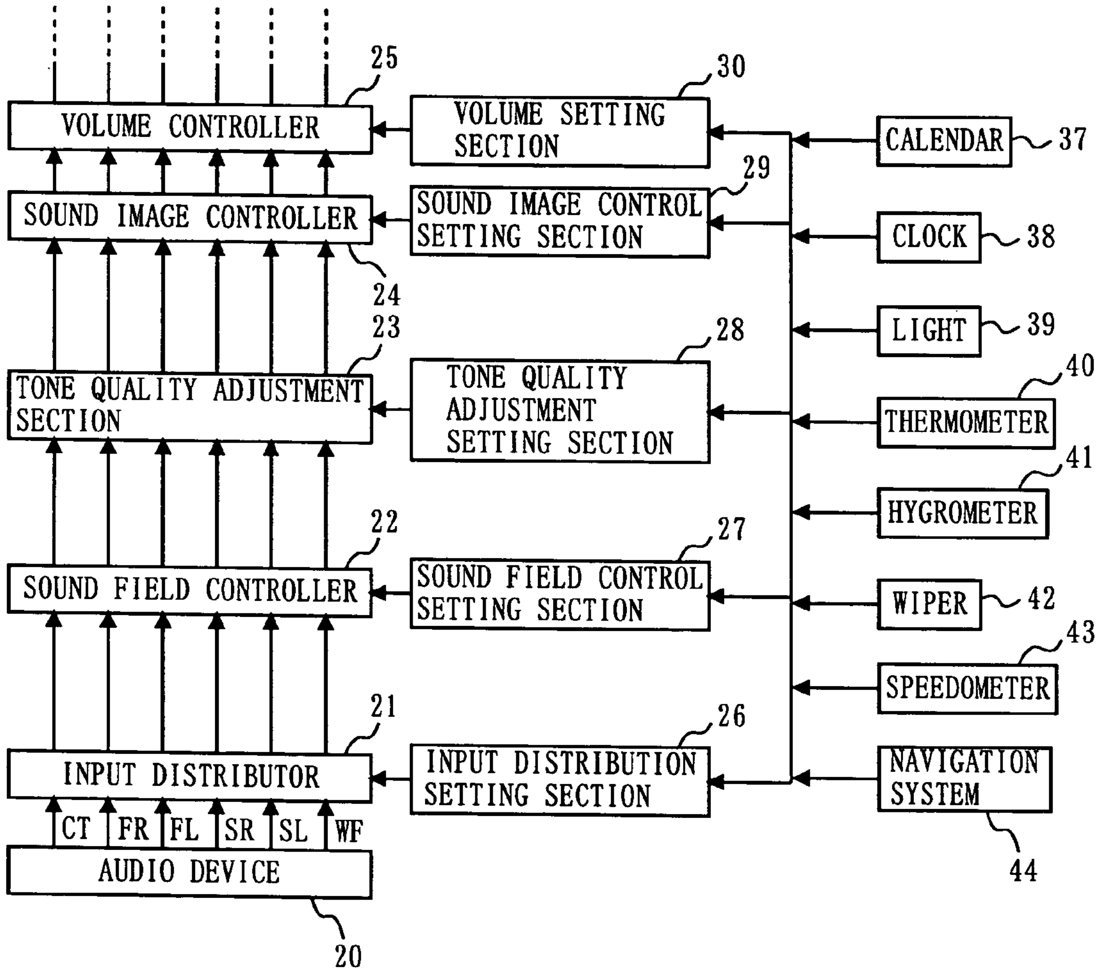
FIG. 18 shows an audio signal adjustment section of the sound field measurement device of Embodiment 4.

Other information available from the automobile 201 can additionally be used in the adjustment of the audio signal as shown in FIG. 18. FIG. 18 shows the sources of the information available from the automobile 201 while omitting the sound field measurement section as shown in FIG. 15.

The month and date can be determined from a calendar 37, and the time can be determined from a clock 38 and a light 39. Therefore, the tone quality, the sense of sound field, the sense of sound image, etc., can be adjusted according to the season of the year or the time of the day. For example, on a cold winter day, the high frequency range level may be decreased while increasing the mid-to-low frequency range to achieve a relatively warm tone quality. In the morning, when the passenger or passengers may like to be invigorated, a vivid tone quality setting can be used, where the low frequency range and the high frequency range are emphasized. Even if the automobile is not provided with the calendar 37 or the clock 38, it is at least possible to determine whether it is in the night (or dark) by determining whether the light 39 is ON.

Since the outside air temperature can be known from a thermometer 40, it is possible, to some extent, to determine the season of the year. The determination precision can be improved by using the calendar 37 in combination.

Since the outside air humidity can be known from a hygrometer 41, it is possible to determine whether it is raining outside. The determination precision can be improved by additionally determining whether a wiper 42 is in operation. When it is raining outside, the noise level increases particularly in the mid-to-high frequency range. In view of this, adjustments can be made by the volume controller 25 and the tone quality adjustment section 23 so that the audio signal will not be masked by the noise.

The driving speed can be known from a speedometer 43 and can be used in the determination of the driving noise. The determination precision can be improved by using the noise level calculator 31 in combination.

Similarly, the engine speed can be known from the tachometer and can be used in the determination of the driving noise. The determination precision can be improved by using the noise level calculator 31 in combination.

Since the location of the automobile can be known from a navigation system 44, the audio signal can be adjusted depending on whether the automobile is running in a city area, along the seashore, on a highland, etc.

With these pieces of information organically combined together, it is possible to more finely tune the audio signal.

While the invention has been described in detail, the foregoing description is in all aspects illustrative and not restrictive. It is understood that numerous other modifications and variations can be devised without departing from the scope of the invention.

What is claimed is:

1. A sound field measurement device, comprising:

a test sound source configured to generate a wide frequency range signal including an audio signal and a test signal;

a plurality of speakers configured to reproduce the audio signal and the test signal included in the wide frequency range signal to output an audio sound and a test sound respectively;

a plurality of microphones configured to detect the test sound when the test sound is outputted from one of said plurality of speakers;

a measurement section configured to determine a number and positions of people present in a sound field, based on test sound detected by said plurality of microphones; and a directionality controller configured to change a directionality of said plurality of microphones toward a position of the one speaker, outputting the test sound, of the plurality of speakers, wherein the test sound source outputs at least a high frequency range signal included in a range from 1 kHz to 10 kHz where the presence or absence of people has a significant influence and a low frequency range signal included in a range from 80 Hz to 800 Hz where the presence or absence of people does not have a substantial influence in a time division manner or at least a wide frequency range signal which includes both the high frequency range signal and the low frequency range signal; and the measurement section includes:

a frequency analyzer configured to analyze frequency characteristics of each of the test sound signals detected by the plurality of microphones;

a high frequency range level calculator and a low frequency range level calculator configured to calculate a high frequency range signal level and a low frequency range signal level, respectively, of each of the test sound signals detected by the plurality of microphones based on the analysis by the frequency analyzer;

a reference value storage section configured to store a reference value which is obtained by normalizing a level value in a predetermined portion of a high frequency range from the high frequency range level calculator in the absence of people in the sound field with a level value in a predetermined portion of a low frequency range from the low frequency range level calculator in the absence of people in the sound field; and the determination section configured to determine the number and positions of people present in the sound field by comparing a normalized value with the reference value stored in the reference value storage section, the normalized value being obtained by normalizing a level value in a predetermined portion of a high frequency range from the high frequency range level calculator with a level value in a predetermined portion of a low frequency range from the low frequency range level calculator.

2. The sound field measurement device according to claim 1, wherein at least two of said plurality of microphones are installed either on a cabin ceiling near a center of a cabin of an automobile, on top of a seat back of a driver's seat or a front passenger's seat near the center of the cabin, around a sun visor of the driver's seat inside the cabin, or around the rear-view mirror inside the cabin.

3. The sound field measurement device according to claim 1, wherein the directionality controller processes signals from at least three of said plurality of microphones so that a directionality of the microphones is strengthened in a direction toward one of the plurality of the speakers which is currently outputting the test sound.

4. The sound field measurement device according to claim 1, wherein the reference value storage section stores, as the reference value, transfer characteristics between each speaker-microphone pair in the absence of people in the sound field, or transfer characteristics between each speaker-microphone pair for each of possible combinations of positions of people in the sound field including the absence of people therein.

5. The sound field measurement device according to claim 1, wherein the determination section determines the presence/absence of a person at a position based on the test sound signals detected by said plurality of microphones when a speaker located close to the position outputs the test sound.

6. The sound field measurement device according to claim 3, wherein:

the plurality of speakers includes at least four speakers including a front-right speaker, a front-left speaker, a rear-right speaker and a rear-left speaker;

one microphone is positioned at an intersection between a straight line between the front-right speaker and the rear-left speaker and another straight line between the front-left speaker and the rear-right speaker; and two microphones other than said one microphone are positioned along the two straight lines, one on each straight line.

* * * * *